United States Patent
Hallam et al.

(10) Patent No.: US 9,824,897 B2
(45) Date of Patent: Nov. 21, 2017

(54) THERMAL PROCESSING IN SILICON

(71) Applicant: NewSouth Innovations Pty Limited, Sydney, New South Wales (AU)

(72) Inventors: Brett Jason Hallam, Bexley (AU); Matthew Bruce Edwards, Elanora Heights (AU); Stuart Ross Wenham, Cronulla (AU); Phillip George Hamer, Kensington (AU); Catherine Emily Chan, Randwick (AU); Chee Mun Chong, Bellevue Hill (AU); Pei Hsuan Lu, Rockdale (AU); Ly Mai, Sefton (AU); Li Hui Song, Kingsford (AU); Adeline Sugianto, Malabar (AU); Alison Maree Wenham, Cronulla (AU); Guang Qi Xu, Randwick (AU)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 0 days.

(21) Appl. No.: 14/905,711

(22) PCT Filed: Jul. 24, 2014

(86) PCT No.: PCT/AU2014/050147
§ 371 (c)(1),
(2) Date: Jan. 15, 2016

(87) PCT Pub. No.: WO2015/010168
PCT Pub. Date: Jan. 29, 2015

(65) Prior Publication Data
US 2016/0172213 A1   Jun. 16, 2016

(30) Foreign Application Priority Data
Jul. 26, 2013   (AU) .................................. 2013902774

(51) Int. Cl.
*H01L 31/048* (2014.01)
*H01L 21/322* (2006.01)
(Continued)

(52) U.S. Cl.
CPC .... *H01L 21/3223* (2013.01); *B32B 17/10036* (2013.01); *B32B 17/10788* (2013.01);
(Continued)

(58) Field of Classification Search
CPC .................................................. H01L 2021/603
See application file for complete search history.

(56) References Cited

U.S. PATENT DOCUMENTS

| | | | | |
|---|---|---|---|---|
| 2009/0133340 A1* | 5/2009 | Shiao | ...................... | H02S 20/23 52/173.3 |
| 2013/0014823 A1* | 1/2013 | Ko | ...................... | H01L 31/0481 136/259 |
| 2013/0037310 A1* | 2/2013 | Kimura | ...................... | C08J 5/24 174/251 |

FOREIGN PATENT DOCUMENTS

| | | |
|---|---|---|
| CN | 102812562 A | 12/2012 |
| WO | WO 2004/107433 | 12/2004 |
| WO | WO 2013/001440 | 1/2013 |

OTHER PUBLICATIONS

International Search Report and Written Opinion for Application No. PCT/AU2014/050147, dated Sep. 8, 2014, 10 pages.
(Continued)

*Primary Examiner* — Cheung Lee
(74) *Attorney, Agent, or Firm* — Nathan S. Smith; McDermott Will & Emery LLP

(57) ABSTRACT

A method is provided for the processing of a device having a crystalline silicon region containing an internal hydrogen source. The method comprises: i) applying encapsulating material to each of the front and rear surfaces of the device to form a lamination; ii) applying pressure to the lamination
(Continued)

and heating the lamination to bond the encapsulating material to the device; and iii) cooling the device, where the heating step or cooling step or both are completed under illumination.

29 Claims, 11 Drawing Sheets

(51) Int. Cl.
    *H01L 23/31* (2006.01)
    *H01L 31/068* (2012.01)
    *H01L 21/225* (2006.01)
    *H01L 21/324* (2006.01)
    *H01L 21/56* (2006.01)
    *B32B 17/10* (2006.01)
    *H01L 31/18* (2006.01)

(52) U.S. Cl.
    CPC ........ *H01L 21/2253* (2013.01); *H01L 21/324* (2013.01); *H01L 21/56* (2013.01); *H01L 23/3107* (2013.01); *H01L 31/048* (2013.01); *H01L 31/0488* (2013.01); *H01L 31/068* (2013.01); *H01L 31/1804* (2013.01); *H01L 31/1864* (2013.01); *H01L 31/1868* (2013.01); *Y02E 10/547* (2013.01); *Y02P 70/521* (2015.11)

(56) References Cited

OTHER PUBLICATIONS

Wilking, et al., "Influence of hydrogen on the regeneration of boron-oxygen related defects in crystalline silicon," May 17, 2013, pp. 194503:1-6, 113.
Chinese Office Action from Chinese Patent Application No. 201480042119.3, dated Jun. 30, 2017.

* cited by examiner

US 9,824,897 B2

THERMAL PROCESSING IN SILICON

INTRODUCTION

The present invention relates to methods of manufacturing solar cells and in particular the invention provides new method of hydrogenation of silicon material.

BACKGROUND

Hydrogenation of crystalline silicon involves the bonding of hydrogen atoms to crystallographic defects or contamination within the silicon lattice in a way that prevents that defect or contaminant from acting as a recombination site for minority charge carriers. This is known as passivation of the particular recombination site. This is important for semiconductor devices that require long minority carrier lifetimes such as solar cells and particularly where cheap silicon is used that often has poor crystallographic quality and/or purity and therefore needs passivation to bring the quality to acceptable levels for high efficiency solar cells.

Low cost silicon in general has much higher densities of silicon crystallographic defects and/or unwanted impurities. These lower the minority carrier lifetime of the silicon and therefore reduce the efficiencies of solar cells made from such material. Passivation of such defects and contaminants to improve minority carrier lifetimes is therefore an important part of being able to fabricate high efficiency solar cells when using lower quality silicon than that routinely used by the microelectronics industry such as with floatzone (FZ) wafers formed from semiconductor grade silicon.

Currently, without a full understanding of the hydrogenation process and its potential, the designs of commercially manufactured solar cell structures are not ideal to facilitate hydrogenation throughout the cell, and this is reflected in the poor bulk lifetimes for technologies using standard commercial grade p-type wafers.

The ability of hydrogen to move throughout silicon is greatly inhibited by interactions with dopant atoms. For example, in equilibrium in n-type silicon, almost all hydrogen is in the negative charge state (H$^-$) and in p-type silicon almost all hydrogen is in the positive charge state (H$^+$). However hydrogen in these charge states in the respective silicon polarity can lead to strong attraction between the hydrogen atom and the respective dopant atoms, making it difficult for the hydrogen atom to move past such dopant atoms. This can lead to the neutralization of the dopant atoms, and thus the hydrogen can no longer move throughout the silicon. This behaviour of hydrogen in silicon has not been well understood or has been overlooked in the past, with the result that attempts at hydrogenation have been less effective than would have been believed by cell designers.

For example, H$^+$ can interact with ionised boron atoms (B$^-$) to form neutral boron-hydrogen (B—H) complexes. Similarly, H$^-$ can interact with ionised phosphorus atoms (P$^+$) to form neutral phosphorus-hydrogen (P—H) complexes.

Boron (B) is a valency 3 element which can be used to dope silicon to produce p-type material when taking on substitutional sites within the silicon lattice. Each such boron atom therefore produces a free "hole", leaving the boron atom with a fixed negative charge. If atomic hydrogen is directed into such a p-type region and if the hydrogen takes on the positive charge state (H+), strong electrostatic forces exist between the B− and H+ atoms, leading to a high probability that the two will react to form a B—H bond, therefore trapping the hydrogen atom at that location but while simultaneously deactivating the boron atom such that electronically it acts as if it were no longer there.

Conversely, phosphorus (P) is a valency 5 element which can be used to dope silicon to produce n-type material when taking on substitutional sites within the silicon lattice. Each such phosphorus atom therefore produces a free "electron", leaving the phosphorus atom with a fixed positive charge. If atomic hydrogen is directed into such an n-type region and if the hydrogen takes on the negative charge state (H−), strong electrostatic forces exist between the P+ and H− atoms, leading to a high probability that the two will react to form a P—H bond, therefore trapping the hydrogen atom at that location but while simultaneously deactivating the phosphorus atom such that electronically it acts as if it were no longer there.

The dissociation of the dopant-hydrogen complexes is difficult as even if there is sufficient thermal energy to dissociate the complex (e.g. >150° C.), the coulombic attraction between the dopant atom and the atomic hydrogen (H$^-$ for phosphorus and H$^+$ for boron) prevents the escape of the hydrogen atom, and a rapid reformation of the dopant-hydrogen complex is likely.

The dissociation of the dopant-hydrogen complexes is difficult, as even if there is sufficient thermal energy to dissociate the complex (e.g. >150° C.), the coulombic attraction between the dopant atom and the atomic hydrogen (H$^-$ for phosphorus and H$^+$ for boron) prevents the escape of the hydrogen atom, and a rapid reformation of the dopant-hydrogen complex is likely.

Minority carrier injection has been observed to enhance the dissociation of dopant-hydrogen complexes. Through minority carrier injection, the dissociation process can occur at much lower temperatures than observed with the absence of minority carrier injection.

In particular, the importance of the minority carrier injection is noted with regard to the associated changes to the charge state of hydrogen. For example, in the dissociation of B—H complexes, during the dissociation process, if the charged hydrogen species (H$^{+)}$ absorbs and electron with a minority carrier, a neutral hydrogen atom (H$^0$) will form. In this state, the hydrogen has high mobility and is unhindered by Coulombic attraction. However H$^0$ is a relatively unstable state and auto-ionises back to H$^+$ in the order of a nanosecond. Subsequently, the H$^0$ is converted back to H$^+$ before it has time to diffuse away from the boron atom and once again forms a B—H complex. However if sufficient electrons are present, the H$^+$ may absorb 2 electrons and form H$^-$, which is a relatively stable charge state and in this charge state, the boron atom repels the H$^-$ and it can therefore move throughout the silicon.

It can now be seen that the main reasons for poor hydrogenation in the past include: heavy doping in emitters blocking hydrogen from penetrating deep within the silicon; absence of hydrogen sources from one or both surfaces; aluminium alloyed regions or metal/silicon interfaces acting as sinks; failure to achieve the right charge state for the atoms of hydrogen to facilitate their bonding to certain types of defects and impurities; and no means of trapping of the hydrogen.

While heavy doping might therefore be seen as a disadvantage, understanding the mechanism that can be used to enhance hydrogenation also leads to the possibility of using heavily doped regions to advantage in other ways.

Hydrogen passivation is typically performed on partially fabricated solar cells using predominately a thermal process. For solar cells with screen-printed contacts hydrogenation is often incorporated into the metallization process, however the presence of molten metal and silicon can act as a sink for hydrogen. In addition, subsequent thermal process can often reactivate some of the passivated recombination sites therefore leading to inadequate hydrogen passivation in silicon solar cell modules.

For example, minority carrier injection has been observed to lead to the permanent deactivation of boron-oxygen defects in Czochralski silicon with simultaneous illumination and heating in the range of 70-230 degrees. This can result in stabilized efficiencies which are substantially higher than that which do not receive the stabilization process. However subsequent thermal processes at temperatures above 230 are observed to destabilize the efficiency and the cells are once again subject to the formation of boron-oxygen defects with minority carrier injection. In addition, thermal processes applied on encapsulated cells above 140 degrees Celsius can lead to issues with the EVA encapsulating layers, and processes above 180 degrees can lead to problems with the interconnections in the solar modules.

SUMMARY

According to a first aspect, a method is provided for the processing of a silicon device, having a crystalline silicon region containing an internal hydrogen source. The method may comprise:
1) applying encapsulating material to each of the front and rear surfaces of the device to form a lamination;
2) applying pressure to the lamination and heating the lamination under illumination to bond the encapsulating material to the device.

The device may also be illuminated during a cooling step following the heating step.

According to a second aspect, a method is provided for the processing of a silicon device, having a crystalline silicon region containing an internal hydrogen source. The method may comprise:
1) applying encapsulating material to each of the front and rear surfaces of the device to form a lamination:
2) applying pressure to the lamination and heating the lamination to bond the encapsulating material to the device;
3) cooling the device under illumination.

The device may also be also illuminated during the heating step.

According to a third aspect, a method is provided for the processing of a silicon device. The silicon device may have a doped region (e.g. valency 3 dopant such as boron, aluminium gallium—or a valency 5 dopant such as phosphorus) in which some of the dopant atoms are deactivated by combining with a hydrogen atom. The method may comprise:
1) heating the device under illumination to dissociate the hydrogen from the dopant atoms with which it is combined; and
2) cooling the device.

According to a fourth aspect, a method is provided for the processing of a silicon device. The silicon device may have a doped region (e.g. valency 3 dopant such as boron, aluminium gallium—or a valency 5 dopant such as phosphorus) in which some of the dopant atoms are deactivated by combining with a hydrogen atom. The method may comprise;
1) heating the device to dissociate the hydrogen from the dopant atoms with which it is combined; and
2) cooling the device under illumination.

The crystalline silicon region containing the hydrogen source may comprise atomic hydrogen contained interstitially within the crystalline silicon of the crystalline silicon region. For example, with hydrogen containing dielectric layers on one or both surfaces of a silicon wafer, heating the wafer for several seconds to a temperature above 700° C. will release large numbers of hydrogen atoms into the silicon, such that if this is done in the dark or if done in the light but with the cool-down carried out in the dark or at low light intensity, then most of the H atoms will occupy interstitial sites. Alternatively, the crystalline silicon region containing the hydrogen source may comprise a doped crystalline silicon region in which some of the dopant atoms are deactivated by combining with a hydrogen atom. During the process some of the deactivated dopant atoms may be reactivated by illuminating the doped region while it is at an elevated temperature.

Illumination while at an elevated temperature may break at least some of the dopant—hydrogen bonds while maintaining conditions, to release hydrogen atoms in a neutral charge state and/or hydrogen atoms charged with the same charge polarity as the dopant atoms, whereby some of the hydrogen drifts from the doped region without re-bonding to the dopant atoms.

Preferably the device is illuminated during both the heating and cooling steps whereby during the process some of the deactivated dopant atoms are reactivated by heating and illuminating the doped region to break at least some of the dopant—hydrogen bonds while maintaining conditions, to create a high concentration of neutral hydrogen ($H^0$) atoms and/or hydrogen atoms charged to the same charge state as the dopant atoms, whereby some of the hydrogen drifts from the doped region without re-bonding to the dopant atoms and cooling the boron doped region while maintaining the illumination to maintain the high concentration of neutral hydrogen The encapsulating material may comprise a boding sheet applied to each surface of the silicon device and a glass sheet over each bonding sheet. The step of applying pressure and heating will cause the bonding sheets to bond to the respective the glass sheet and the respective surface of the silicon device.

Each bonding sheet may be a sheet of ethylene vinyl acetate (EVA) material.

The doped region may be a surface region of the device.

The heating of the device may comprise heating at least a region of the device to at least 40° C. while simultaneously illuminating at least some of the device with at least one light source whereby the cumulative power of all the incident photons with sufficient energy to generate electron hole pairs within the silicon (in other words photons with energy levels above the bandgap of silicon of 1.12 eV) is at least 20 $mW/cm^2$.

The illumination from the at least one light sources may be provided at levels whereby the cumulative power of all the incident photons with sufficient energy to generate electron hole pairs within the silicon is at least 50 $mW/cm^2$, or 60 $mW/cm^2$, or 70 $mW/cm^2$, or 80 $mW/cm^2$, or 90 $mW/cm^2$, or 100 $mW/cm^2$, or 150 $mW/cm^2$, 2000 $mW/cm^2$, or 300 $mW/cm^2$, or 400 $mW/cm^2$, or 500 $mW/cm^2$, or 600 $mW/cm^2$, or 700 $mW/cm^2$, or 800 $mW/cm^2$, or 900 $mW/cm^2$, or 1000 $mW/cm^2$, or 1500 $mW/cm^2$, or 2000 $mW/cm^2$, or 3000 $mW/cm^2$, or 5000 $mW/cm^2$, or 10000 $mW/cm^2$, or 15000 $mW/cm^2$, or 2000 $mW/cm^2$, or up to a light intensity at which the silicon begins to melt.

Preferably, for each of the ranges of cumulative power mentioned above, the heating of the device may comprise heating at least a region of the device to at least 100° C. The heating may be followed by cooling the device while simultaneously illuminating at least some of the device with at least one light source whereby the cumulative power of all the incident photons with sufficient energy to generate electron hole pairs within the silicon is at least 20 mW/cm². Alternatively the heating of the device may comprise heating the device to at least 140° C. Further, the heating of the device may comprise heating the device to at least 150° C., 180° C., or 200° C. depending on the conditions required and the thermal sensitivity of existing structures in the device.

Minority carrier concentrations may be controlled, through the use of light and heat, during a cool-down period after heating, to maintain hydrogen charge states during cool-down to minimise reactivation of defects, or reactivation of dopants, to which hydrogen has previously bound.

The intensity of illumination applied to the device may be varied during the thermal processing and cooling. The intensity of illumination applied to the device may be increased, or decreased, during a cooling stage after the hydrogenation or other thermal processes. In particular the intensity of illumination applied to the device may be increased, or decreased, with decreasing temperature of the device.

The source of illumination applied to the device may be an array of LEDs. The source of illumination applied to the device may also be one or more infra-red lamps. The illumination applied to the device may be pulsed. The intensity of illumination applied to the device may be controlled to maintain the Fermi level at a value of 0.10 to 0.22 ev above mid-gap.

The method may be used to process silicon for use in the fabrication of a photovoltaic device having at least one rectifying junction.

The dopant introduced in excess of requirements may be a p-type (valency 3) dopant such as boron, aluminium or gallium or an n-type (valency 3) dopant such as phosphorus. The method is particularly effective when boron is uses as a dopant in silicon. The doped region may also be doped with boron and phosphorus.

Hydrogen may be initially introduced into the silicon by forming a dielectric which contains hydrogen, such as silicon nitride, silicon oxynitride, aluminium oxides etc. on a surface of the silicon and subsequently heating the device to migrate the hydrogen into the silicon. Preferably dielectric hydrogen sources will be formed (at least temporarily) on each of the front and rear surfaces of the silicon. In order to deliberately deactivate dopant atoms in surface regions of the silicon, the hydrogen may be introduced into the silicon from the hydrogen source by heating the device in the absence of illumination or in low illumination conditions (e.g. only unavoidable light emitting from the light source).

For hydrogen sources external to the silicon, such as dielectric layers, the method will be more effective when silicon surface n-type diffused layers through which hydrogen must diffuse have peak net active doping concentrations (i.e. dopant atoms that have not been deactivated) of $1\times10^{20}$ atoms/cm³ or less. Similarly, the method will be more effective when any silicon surface diffused p-type layers through which hydrogen must diffuse have peak net active doping concentrations of $1\times10^{19}$ atoms/cm³ or less.

BRIEF DESCRIPTION OF THE DRAWINGS

Embodiments of the invention will now be described, by way of example with reference to the accompanying drawings in which.

DETAILED DESCRIPTION

Figure 1:
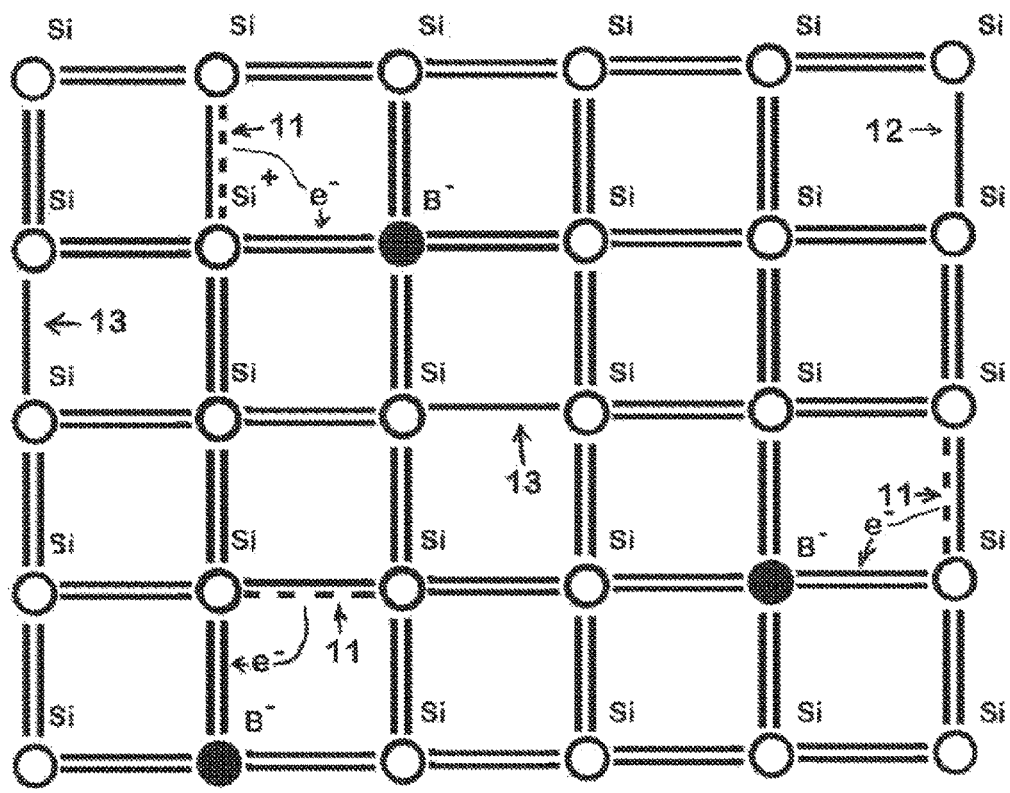
FIG. 1 diagrammatically represents a p-type silicon crystal lattice structure (boron doped)

Processes described herein provide a method for altering the active dopant density through simple hydrogenation processes, by reactivating dopants to free hydrogen stored in dopant—hydrogen complexes such that the released hydrogen is available to passivate recombination sites within the device. This uniquely provides the opportunity for using a hydrogen source previously created internally within the silicon to release the atomic hydrogen through the process of reactivating dopant atoms. In particular the process uses the lamination step which is typically the final thermal process in cell manufacture to passivate defects in the cell. Because the lamination is the final thermal process in the manufacturing sequence it represents the last point at which passivation of defects might be inadvertently reversed. By creating conditions for actively passivating the cell during the lamination step a much better passivation should be expected.

Storing Hydrogen within the Silicon

Hydrogen may be incorporated into silicon by a number of methods but one commonly used method involves depositing a dielectric hydrogen source on one or more surfaces of the silicon and heating the structure to release hydrogen from the dielectric into the silicon. For example, with hydrogen containing dielectric layers on one or both surfaces of a silicon wafer, heating the wafer for several seconds to a temperature above 700° C. will release large numbers of hydrogen atoms into the silicon, such that if this is done in the dark or if done in the light but with the cool-down carried out in the dark or at low light intensity, then most of the H atoms will occupy interstitial sites. However once in the silicon the hydrogen may become trapped, by combining with dopant atoms in the silicon.

In order to more readily move hydrogen throughout the silicon, and to thereby enhance the effectiveness of hydrogen passivation process, it is desirable to maintain or convert the hydrogen into the neutral charge state ($H^0$), which is free from electrostatic effects. Alternatively, converting the atomic hydrogen to the same charge state as the dopant atom of doped silicon (i.e. $H^-$ for p-type and $H^+$ for n-type) can result in electrostatic repulsion from the fixed charge dopant atoms in the silicon lattice. Therefore, in boron doped (p-type) silicon, converting the atomic hydrogen into the negative charge state ($H^-$) can result in electrostatic repulsion from the fixed negatively charged boron atoms in the silicon lattice. Therefore in p-type silicon, it is desirable to use minority carrier injection, in particular through the use of illumination to increase the fractional concentration of $H^0$ and $H^-$. Furthermore, using a pulsed light source can transition through conditions that are more favourable to generate the desired minority charge species of hydrogen or all charge species whilst minimizing increases in temperature. Doing so, allows the use of lower instantaneous illumination intensities than that are required for steady state conditions which lead to an increase in the temperature of the silicon. The hydrogen can be left in doped surface regions for use later to passivate defects throughout the silicon, or the passivation may be performed early in the processing sequence in which case the hydrogen must be distributed throughout the silicon at that time. Further passivation can then be performed later using the distributed hydrogen to repassivate any defects that have been reactivated during other processing such as contact formation. P-type silicon has been found to be particularly useful for hydrogen storage although n-type silicon can also store hydrogen.

Once the hydrogen is distributed throughout the silicon, it is desirable to trap the hydrogen in the silicon such that it cannot escape during subsequent processing, particularly at the metal/Si interfaces. Performing a process which does not incorporate minority carrier injection leads to a high fractional concentration of $H^+$ which can become trapped by the substitutional boron atoms, particularly when the thermal treatment is performed below 150 degrees Celsius. Subsequently, the boron atoms can be reactivated to release the bound hydrogen.

During a subsequent process, the hydrogen can be released from the boron atoms through the use of minority carrier injection and/or temperatures above 150 degrees to allow the passivation of defects within the device. During this process, either a pulsed or continuous illumination source may be used. Preferably, this process is performed during the last thermal process in the production of a photovoltaic module, which is typically the module lamination process.

By previously dispersing the hydrogen throughout the silicon before trapping it, during the process in which the passivation takes place, hydrogen is not required to travel large distances to reach recombination sites and therefore low temperatures can be used.

In particular, the release of hydrogen from the trapped states can be performed during the lamination process whereby the lamination tool provides sufficient illumination intensities to increase the fractional concentrations of $H^0$ and $H^-$, at a temperature typically around 150 degrees Celsius. For this process, the illumination source is preferably pulsed to allow high illumination intensities to generate high concentrations of the minority hydrogen charge species whilst avoiding excessive temperature increases.

This allows the hydrogen passivation to take place during the last thermal process and therefore avoids the risk of the reactivation of defects during subsequent processes, and also avoids issues associated with damage to the module performing thermal processes above 150 degrees after the encapsulation process.

Preferably, illumination is also incorporated into the cool down section of the lamination tool to ensure effective hydrogen passivation is retained in the finished module.

Creating an Internal Hydrogen Source

The hydrogenation process as described above can be performed in such a way as to manipulate the charge states of the hydrogen so that it can facilitate either increased or decreased formation of the B—H bonds (deactivation of the boron atoms) and therefore also either increased or decreased breaking of the B—H bonds (with corresponding reactivation of the boron atoms).

Extra dopant atoms such as boron can be diffused, grown, implanted etc. into the silicon, and then in the presence of a hydrogen source such as from a dielectric, the extra dopants can be deactivated by a process that manipulates the charge state of hydrogen to enable high concentrations of $H^+$ to bond with and deactivate the $B^-$. For boron dopants, this can be done by performing hydrogenation at a temperature in the range 200-500° C. in the dark or with low illumination. Each boron atom that is deactivated is therefore bound to a hydrogen atom, so that hydrogen atoms can be located all throughout the silicon wafer in the areas that were deactivated by the hydrogenation process, essentially creating internal stores of hydrogen throughout the wafer. These hydrogen stores can then be accessed via a hydrogenation process by providing sufficient thermal energy to break the bonds while simultaneously raising the electron concentration sufficiently (such as via illumination with high enough intensity light) to increase the percentage of the atomic hydrogen in the neutral or negative charge states that can therefore escape from their respective boron atoms. Such released hydrogen is therefore again mobile and able to be used for other purposes, such as bulk or localised hydrogenation or passivation of surface, bulk or grain boundary defects in the silicon, either before or after completion of manufacture of the device.

Figure 2:
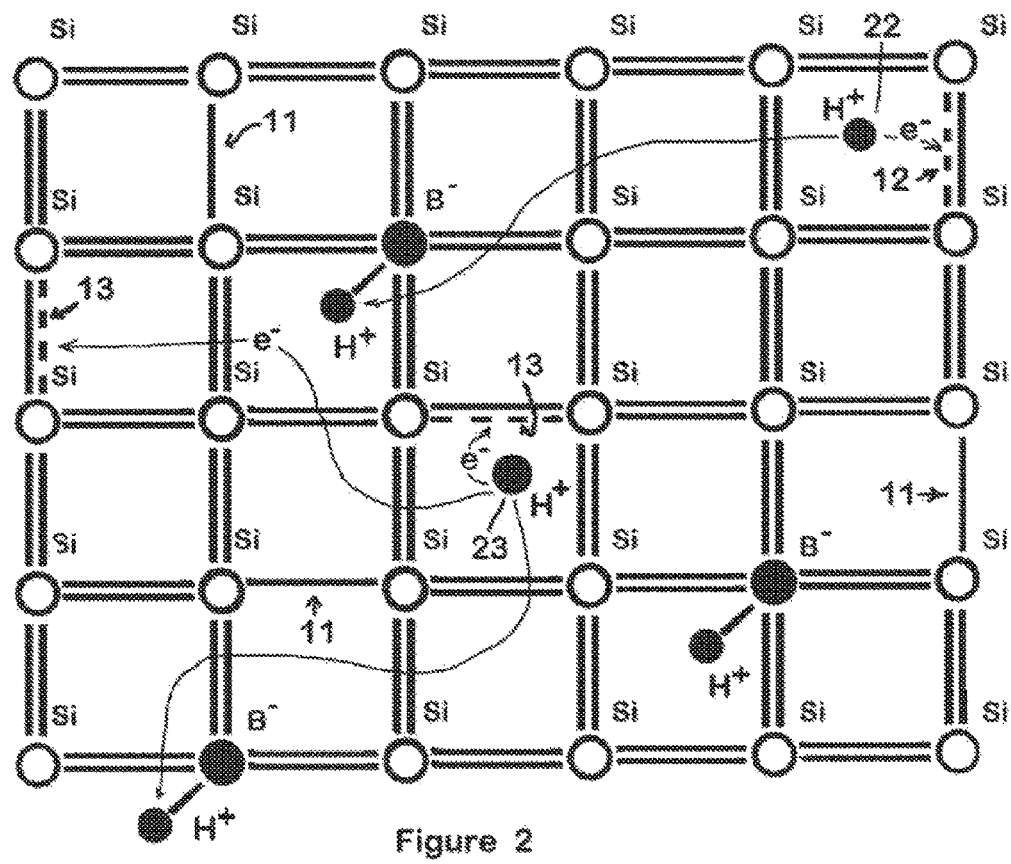
FIG. 2 diagrammatically represents the p-type silicon crystal lattice structure of FIG. 1 after hydrogenation.

As mentioned in the 'Background' above, boron (B) is a valency 3 element which can be used to dope silicon to produce p-type material when taking on substitutional sites within the silicon lattice, as illustrated in FIG. 1. Each such boron atom therefore produces a free "hole" 11, leaving the boron atom with a fixed negative charge. Additional holes 12, 13 are seen in FIG. 1, which will have moved away from the doping sights where they were created. Referring to FIG. 2, if neutral atomic hydrogen 22 drifts into such a p-type region and if the hydrogen takes on the positive charge state ($H^+$), such as by giving up an electron which may subsequently combine with a hole 12 as the hydrogen passes through the silicon lattice, strong electrostatic forces exist between the $B^-$ and $H^+$ atoms, leading to a high probability that the two will react to form a B—H bond, therefore trapping the hydrogen atom at that location but while simultaneously deactivating the boron atom such that electronically it acts as if it were no longer present. Similarly, if a negative hydrogen ion 23 drifts into such a p-type region, the hydrogen may take on the positive charge state ($H^+$), by giving up two electrons which may subsequently combine with a holes 13 as the hydrogen passes through the silicon lattice.

Figure 3:
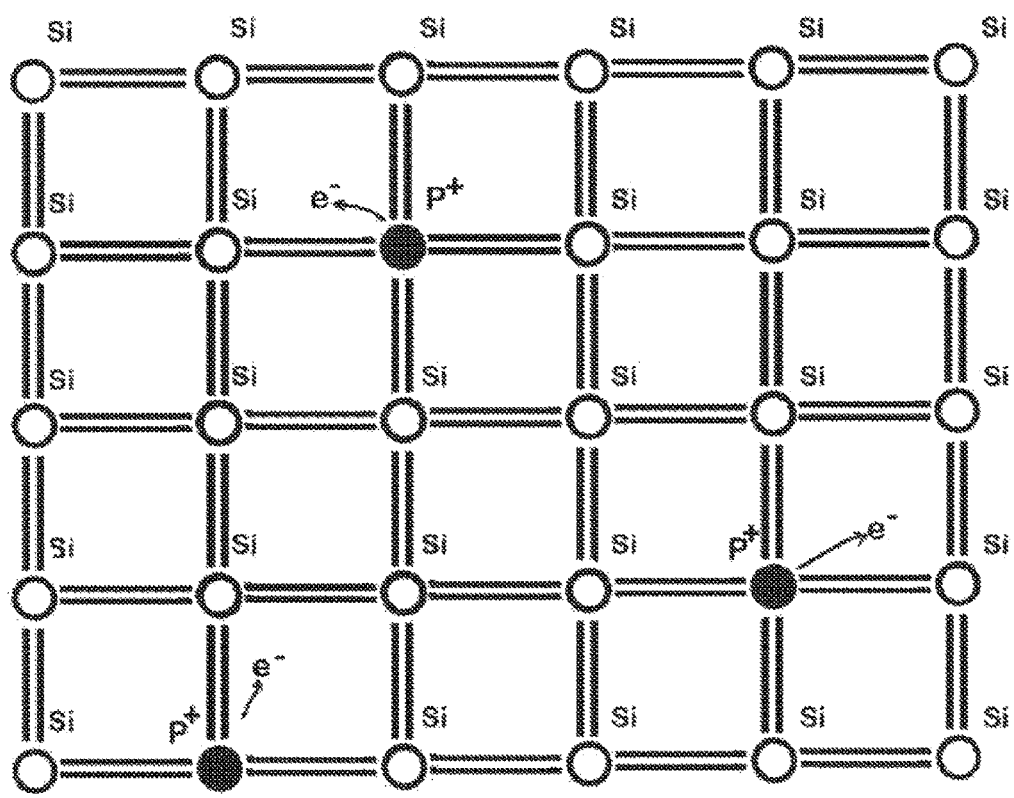
FIG. 3 diagrammatically represents an n-type silicon crystal lattice structure (phosphorus doped)
Figure 4:
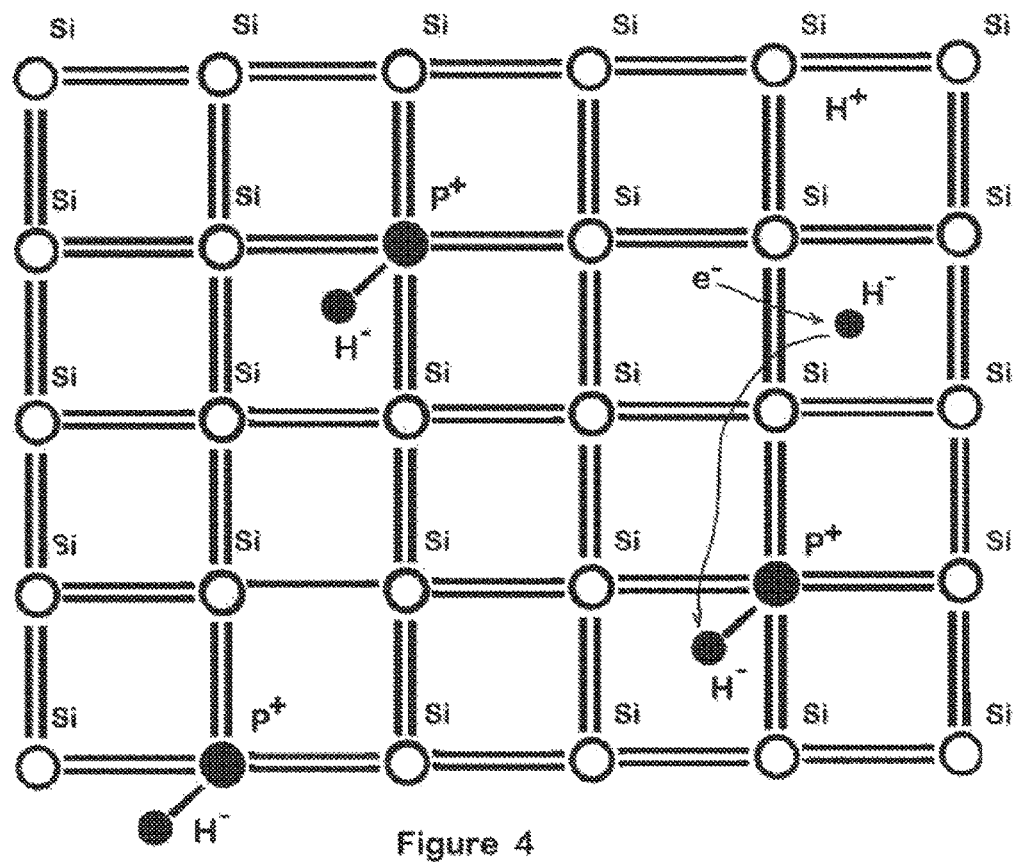
FIG. 4 diagrammatically represents the n-type silicon crystal lattice structure of FIG. 3 after hydrogenation.

Similarly, phosphorus (P) is a valency 5 element which can be used to dope silicon to produce n-type material when taking on substitutional sites within the silicon lattice, as illustrated in FIG. 3. Each such phosphorus atom therefore produces a free "electron" 31, leaving the phosphorus atom with a fixed positive charge. Referring to FIG. 4, if neutral atomic hydrogen is directed into such an n-type region and if an electron joins the hydrogen atom such that the hydrogen takes on the negative charge state (H—), strong electrostatic forces exist between the $P^+$ and $H^-$ atoms, leading to a high probability that the two will react to form a P—H bond, therefore trapping the hydrogen atom at that location but while simultaneously deactivating the phosphorus atom such that electronically it acts as if it were no longer there. Similarly, if a positively charged hydrogen ion drifts into such an n-type region, the hydrogen may take on a negative charge state ($H^-$) by two electrons joining the $H^+$ atom, strong electrostatic forces will exist between the $P^+$ and $H^-$ atoms.

The dissociation of the dopant-hydrogen complexes is difficult, as even if there is sufficient thermal energy to dissociate the complex, the Coulombic attraction between the dopant atom and the atomic hydrogen ($H^-$ for phosphorus and $H^+$ for boron) prevents the escape of the hydrogen atom, and a rapid reformation of the dopant-hydrogen complex is likely. Thus if excessive dopant is added to a silicon device, hydrogen may be introduced in the appropriate charge state to deactivate the dopant. The dominant charge state for hydrogen in p-type silicon is $H^+$ and thus it is relatively simple to deactivate boron dopant atoms close to a silicon surface, however the $H^+$ will not have high mobility and will not travel far before being captured. In the simple case the charge state may be altered by heating which can allow $H^+$ to penetrate further into a doped region and with removal of the heat source will lock the hydrogen in when it has bonded with a dopant. However heating alone is less effective when trying to release hydrogen that is bonded to dopant atoms, to reactivate the dopant atoms, as the hydrogen will re-bond, particularly during cooling. Similarly in n-type silicon, $H^-$ is the dominant charge state and while heating will help in increasing the size of the region of deactivation of n-type dopant atoms, it will not be particularly effective in reactivation.

Figure 5:
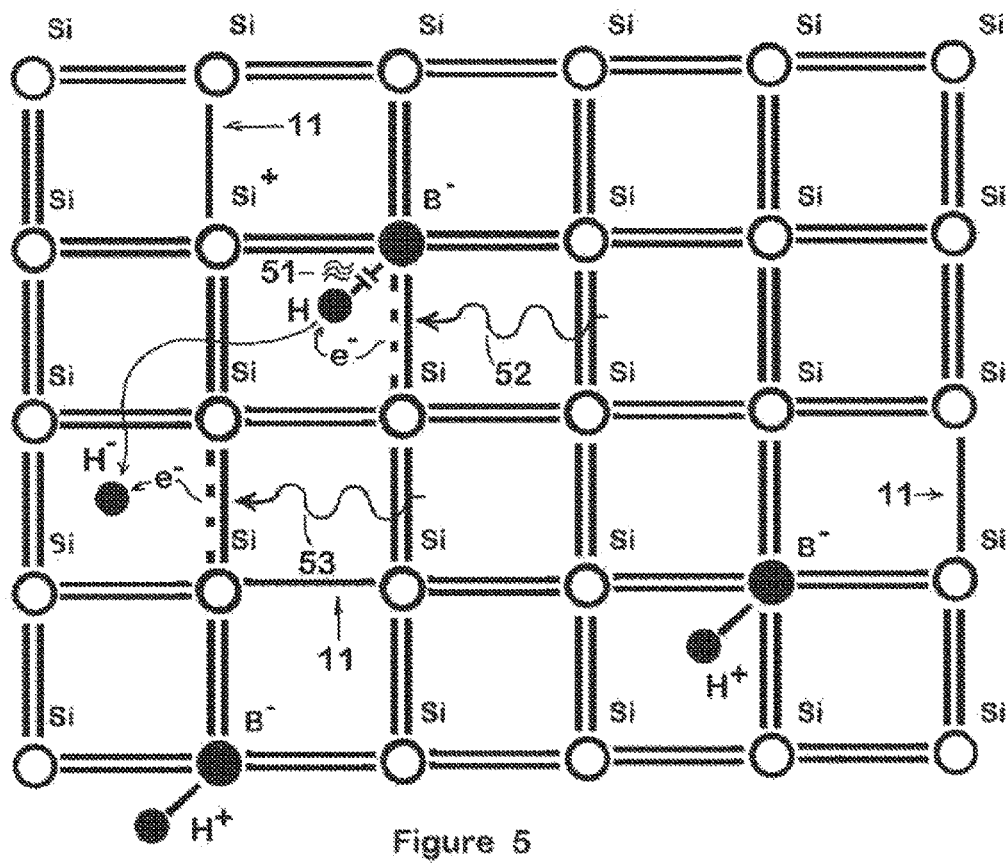
FIG. 5 diagrammatically represents the p-type silicon crystal lattice structure of FIG. 2 showing the reactivation of the boron dopant with the application of heat and light.
Figure 6:
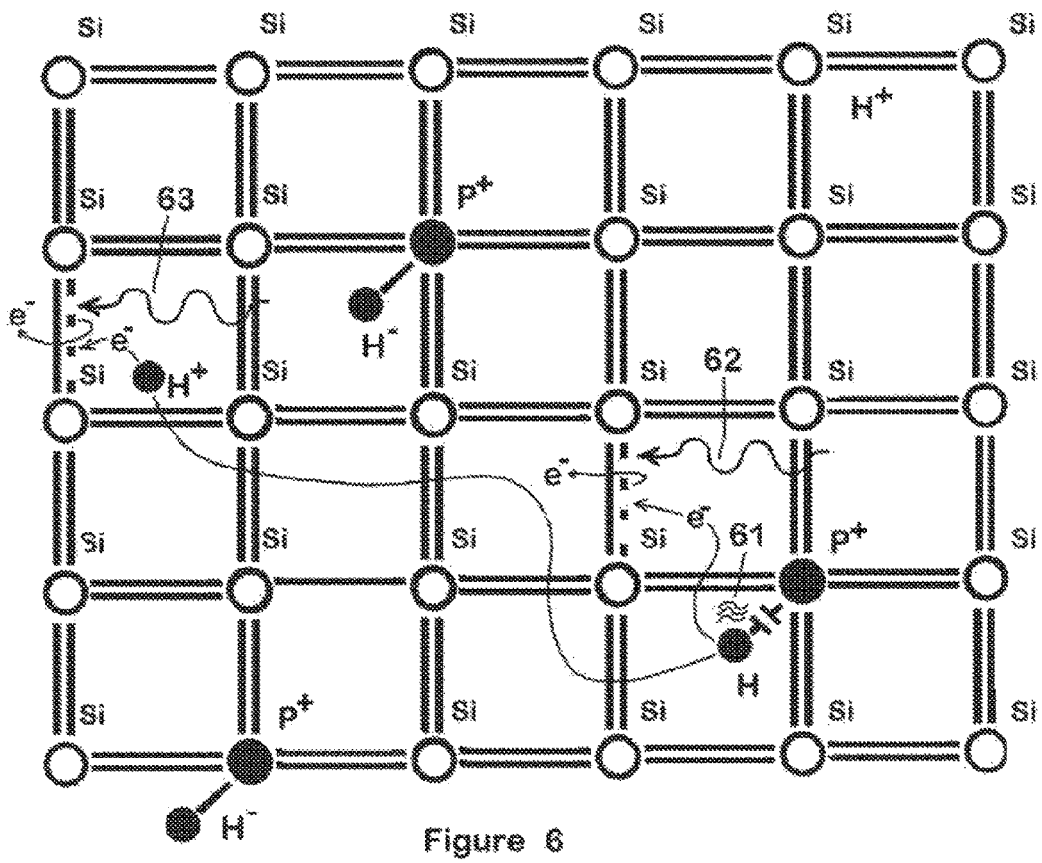
FIG. 6 diagrammatically represents the n-type silicon crystal lattice structure of FIG. 4 showing the reactivation of the phosphorus dopant with the application of heat and light.

Referring to FIGS. 5 & 6, by increasing the minority carrier concentration (the electrons within the p-type silicon or the holes within n-type silicon), it is possible to greatly increase the concentration of hydrogen atoms in the neutral charge state, or even to cause hydrogen atoms to adopt the same charge state as the ionised dopants atoms of the doped region (so in the case of boron doped material where the ionised boron atoms will be negatively charged, the hydrogen atoms may be caused to become negatively charged also, resulting in the hydrogen and boron repelling one another). This can be achieved somewhat by heating the silicon wafer, but is far more effective when the wafer is simultaneously illuminated with bright light to generate many additional minority carriers. Without the bright light, the temperature needed to sufficiently increase the minority carrier concentrations is too great and causes damage to the device being fabricated and the effect will naturally reverse during cooling. With the combination of heat and light, the minority carrier concentrations can be increased sufficiently to allow a large increase in the concentration of hydrogen atoms that have a single electron attached to the hydrogen atom nucleus, therefore giving neutral charge state. It is also possible to significantly increase in the concentration of hydrogen atoms that have two electrons attached to the hydrogen atom nucleus, therefore giving a negative charge state. Thus it is possible to create the hydrogen atoms that are no longer impeded by the strong coulombic forces from the fixed negative or positive ions in the lattice that otherwise drastically reduce its mobility allowing the hydrogen to move away from the dopant atoms to which it would otherwise bond. The neutral hydrogen atoms (and negative Hydrogen ions) are also more effective at bonding to many types of recombination sites due to the presence of the electron with the hydrogen atom. As seen in FIG. 5, the coulombic forces holding hydrogen and boron atoms together may be disrupted by thermal energy 51, releasing $H^+$ ions, while photons 52, 53 striking the silicon lattice may release electrons to form electron-hole pairs. Some of the thus generated electrons will then be free to combine with the $H^+$ ions to form neutral hydrogen atoms. In FIG. 5 it can be seen that if sufficient electrons are present, the hydrogen may join with more than one electron to form a negative hydrogen ion. The equivalent process for n-type material is illustrated in FIG. 6 where the coulombic forces holding hydrogen and boron atoms together may again be disrupted by thermal energy 61, releasing $H^-$ ions. Photons 62, 63 striking the silicon lattice may release electrons to form electron-hole pairs and the $H^-$ ions may subsequently donate one of their electrons to one of the generated holes (which, although shown in FIG. 6 to be adjacent to the dopant that generated it, may have in fact moved away before recombining) to form neutral hydrogen atoms.

Thus there are four advantages that be achieved by overdoping regions on the device:
1) active dopant concentration may be controlled by deactivation and reactivation of dopants as required;
2) dopant control (referred to in (1) above) can take place in localised areas so as to create localised regions of varying active doping concentration and even varying polarity such as may be useful for selective emitters or isolation regions;
3) over doped regions that are subsequently deactivated with hydrogen can later be used as internal hydrogen sources for hydrogenation of defects;

4) over doped regions that are subsequently deactivated with hydrogen can later be used to facilitate localised internal hydrogen sources for hydrogenation of localised defects or regions either during device fabrication or following device completion.

Figure 7:
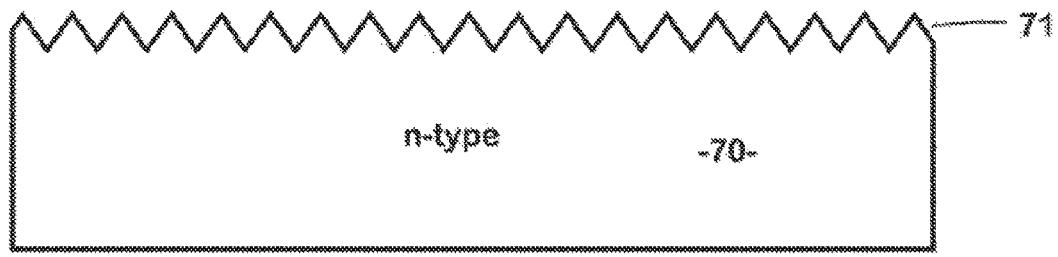
FIG. 7 diagrammatically illustrates a textured n-type wafer in which an embodiment of the invention may be formed.
Figure 8:
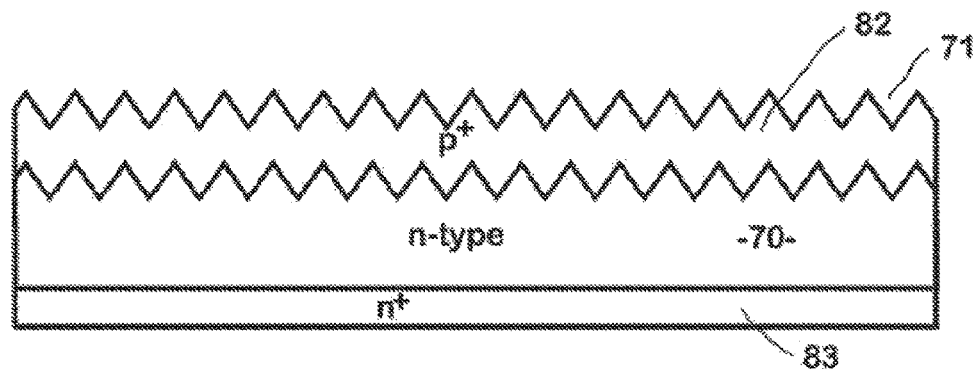
FIG. 8 diagrammatically illustrates the wafer of FIG. 7 after initial doping of the front and rear surfaces.
Figure 9:
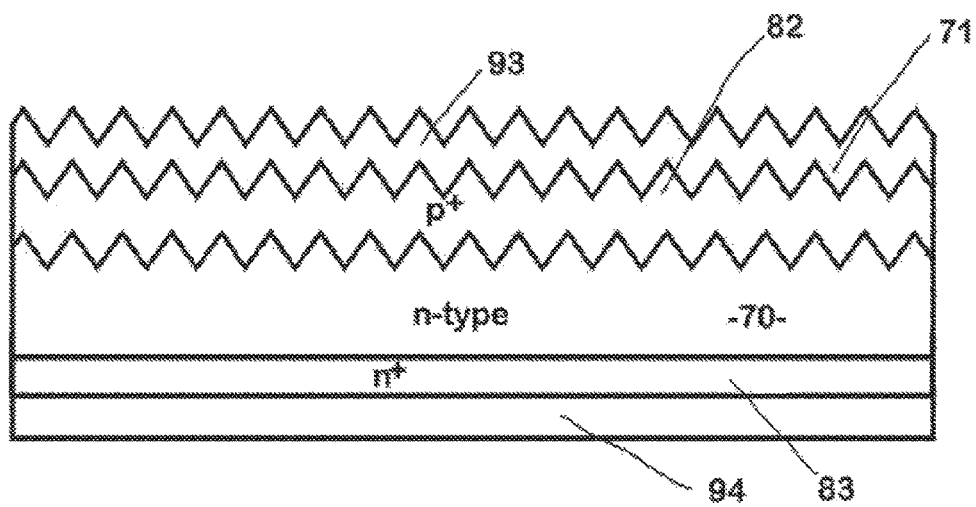
FIG. 9 diagrammatically illustrates the wafer of FIG. 8 after dielectric layers are added.
Figure 10:
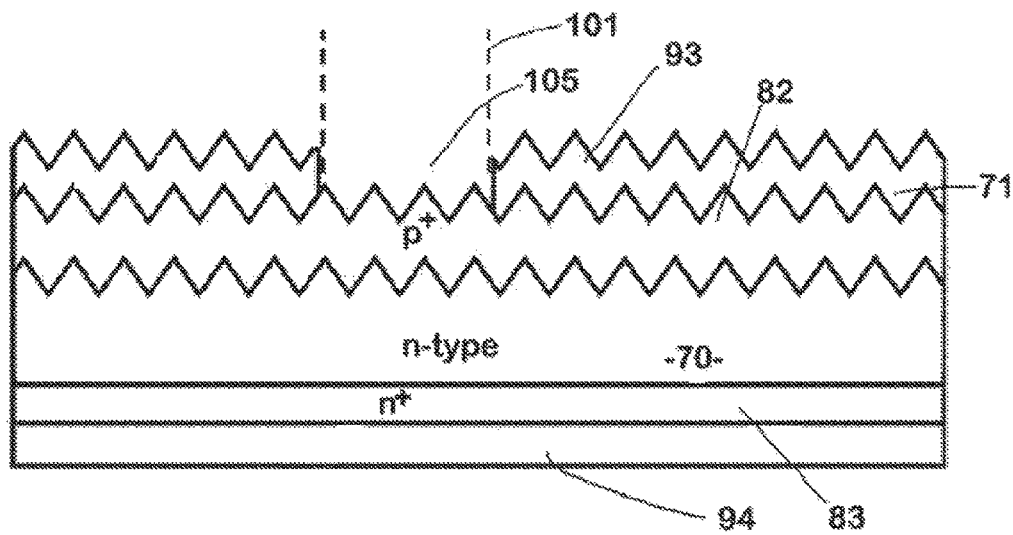
FIG. 10 diagrammatically illustrates the wafer of FIG. 8 after patterning of the top surface dielectric.
Figure 11:
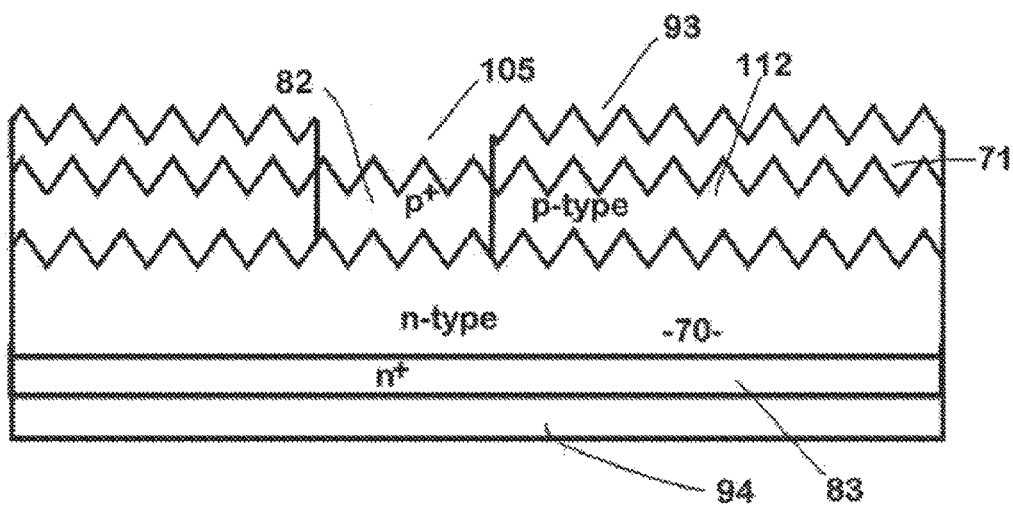
FIG. 11 diagrammatically illustrates the wafer of FIG. 10 after hydrogenation of the emitter region.

1. Deliberate Addition, of Extra Boron (B) and Subsequent Deactivation by Hydrogen in Localised Areas to Form a Selective Emitter Example 1—Local Deactivation Boron (or other dopants) can be intentionally added to the silicon. By manipulating the charge state of hydrogen in some or all areas of the device and providing sufficient thermal energy (typically 150°-500° C.) to increase the amount and mobility of the hydrogen, the boron can be de-activated (or re-activated as desired)—by enabling boron & hydrogen to bond together (or break and separate if boron reactivation is desired). This has many important implementations such as profiling resistivity in an emitter to form a selective Emitter, which can be done in a number of ways including but not limited to:

1) Referring to FIG. 7, an n-type wafer 70 is textured 71;
2) A boron diffusion of the top surface to notionally achieve a p$^+$ region with a sheet resistance of 45-55Ω/☐ (but which could be anywhere within a range of 1-80Ω/☐) creates an emitter layer 82 seen in FIG. 8;
3) A phosphorus diffusion 93 may also be added to the rear surface to again notionally achieve an n$^+$ region with a sheet resistance of 45-55Ω/☐ (but which could be anywhere within a range of 1-80Ω/☐) as also seen in FIG. 8;
4) A front surface dielectric layer 93 and a rear surface dielectric layer 94 are then deposited as seen in FIG. 9. The dielectric layers 93 & 94 act as hydrogen sources and may be selected from hydrogen containing dielectric materials such as silicon nitride, silicon oxynitride, aluminium oxides etc.;
5) The front surface dielectric layer 93 is patterned as seen in FIG. 10, to create openings 105 for emitter metallisation. This can be done by a laser 101, by screen printing or inkjet patterning or other suitable known processes;
6) Referring to FIG. 11, hydrogenation of the emitter is performed, in areas of silicon 112 where the dielectric 93 has not been removed (i.e. where hydrogen source is present), such as by heating the device to 400° C. in darkness or in low light. This process manipulates the charge state in such a way that boron is deactivated wherever hydrogen is present. Boron is deactivated by hydrogen which bonds with the negative boron atoms that are active in the silicon lattice. Hydrogenation performed in a manner which maximises the amount of H$^+$ present will enable the H$^+$ to bond with the B$^-$ thereby de-activating the boron and creating higher sheet resistivity material in these regions, while leaving lower sheet resistivity regions 82 where the dielectric hydrogen source has been removed to form openings 105 for the subsequent formation of metal contacts. Note that the percentage of atomic hydrogen in the positive charge state is maximised by keeping the electron concentration low such as by minimising the light generated by the heating sources which has photons with energy levels above the bandgap of silicon (1.12 eV) and by avoiding temperatures significantly above the range of 300°-500° C. necessary for reasonable hydrogen mobility and the release of hydrogen from the dielectric hydrogen sources 93.

Figure 12:
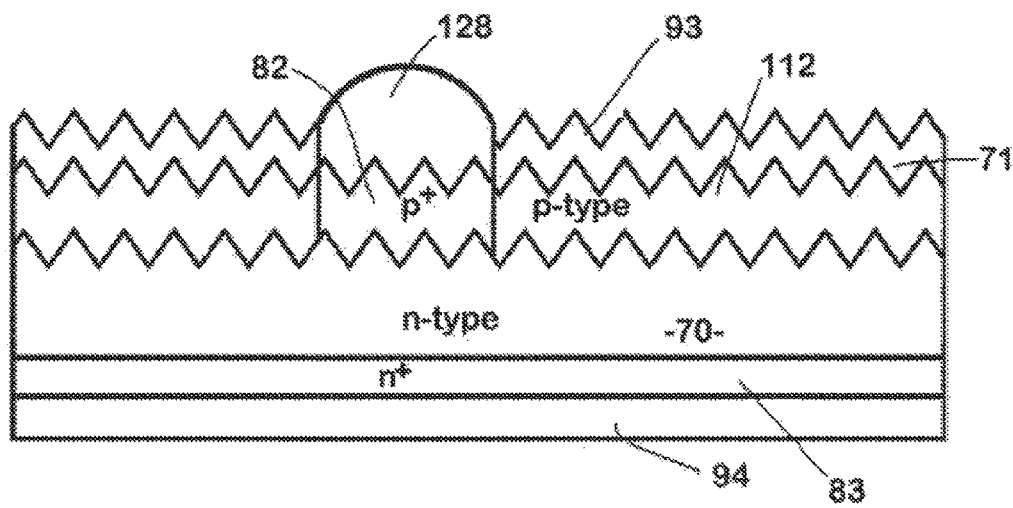
FIG. 12 diagrammatically illustrates the wafer of FIG. 11 after emitter metallisation is applied.
Figure 13:
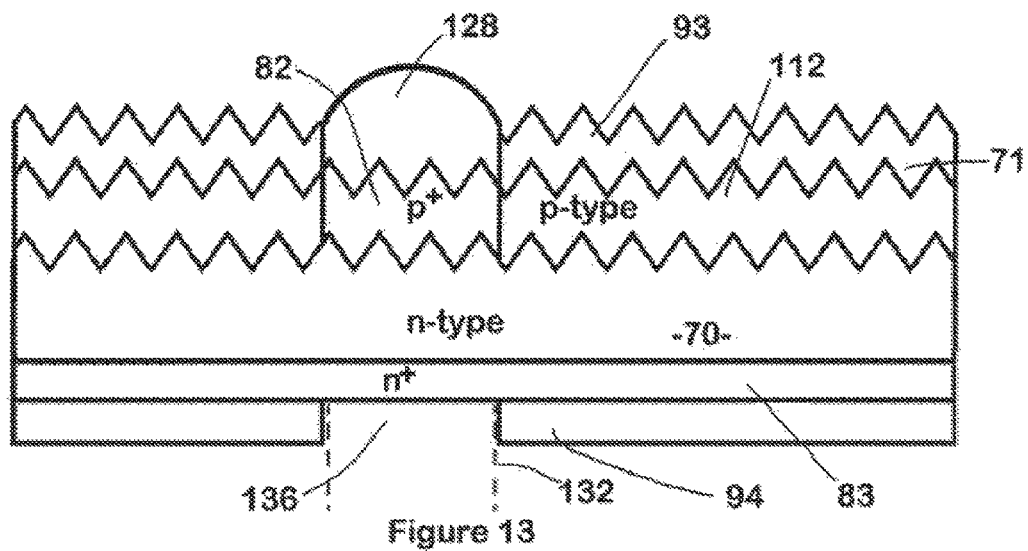
FIG. 13 diagrammatically illustrates the wafer of FIG. 12 after patterning of the rear surface dielectric.
Figure 14:
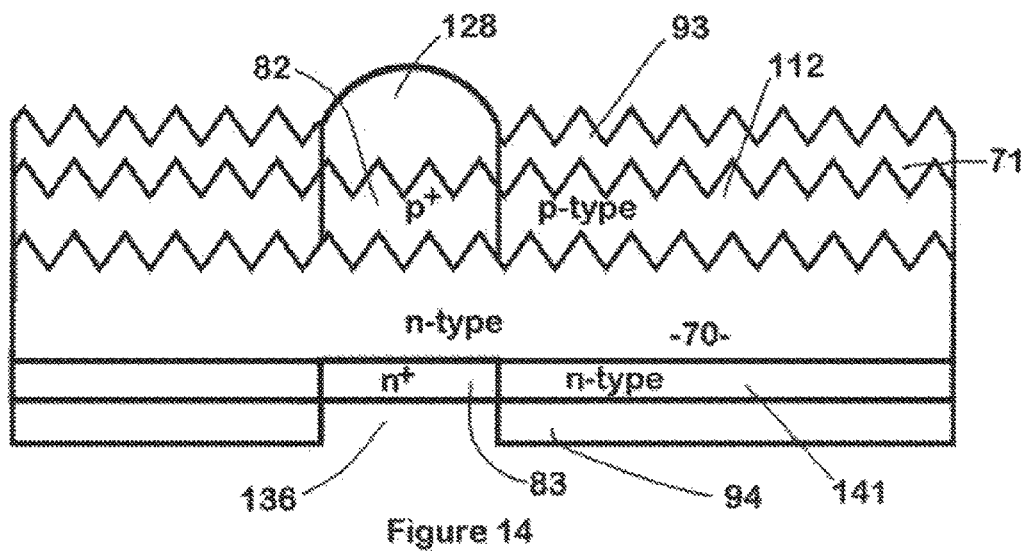
FIG. 14 diagrammatically illustrates the wafer of FIG. 13 after hydrogenation of the rear doped region.

7) Metal contacts 128 may then be applied to the exposed p+ regions 82, such as by plating or aligned screen printing, as seen in FIG. 12.
8) The rear surface dielectric layer 94 is patterned as seen in FIG. 13, to create openings 136 for rear metallisation. This can be done by a laser 132, by screen printing or inkjet patterning or other suitable known processes;
9) Referring to FIG. 14, hydrogenation of the n+ region of the rear surface is performed, in areas of silicon 141 where the dielectric 94 has not been removed (i.e. where hydrogen source is present), such as by heating the device to 400° C. in darkness or low light. This process manipulates the charge state to maximise the H$^-$ concentration while still allowing release of hydrogen from the hydrogen source in such a way that phosphorus is deactivated wherever hydrogen is present. Phosphorus is deactivated by hydrogen which bonds with the positive phosphorus atoms that are active in the silicon lattice. Hydrogenation performed in a manner which maximises the amount of H$^-$ present will enable the H$^-$ to bond with the P$^+$ thereby de-activating the phosphorus and creating higher sheet resistivity material in these regions, while leaving lower sheet resistivity regions 83 where the dielectric hydrogen source 94 has been removed to form openings 136 for the subsequent formation of metal contacts. Note that the percentage of atomic hydrogen in the negative charge state is maximised by keeping the hole concentration low such as by minimising the light generated by the heating sources which has photons with energy levels above the bandgap of silicon (1.12 eV) and by avoiding temperatures significantly above the 300°-500° C. range that is desirable for reasonable hydrogen mobility and the release of hydrogen from the dielectric hydrogen sources 94.

For simplicity, the identical conditions have been described for boron and phosphorus deactivation so as to facilitate simultaneous deactivation of both the boron at the front and phosphorus at the rear, which would removes step 9 but would require the rear opening step (step 8) to be performed before the hydrogenation step (step 6). However for optimal electronic performance, different hydrogenation (deactivation) processing conditions may be beneficial for the boron and phosphorus such that the two processes should therefore be carried out separately as described above with reference to FIGS. 7-15.
10) Metal contacts 156 may then be applied to the exposed n$^+$ regions 83, such as by plating or aligned screen printing, as seen in FIG. 15.

Figure 15:
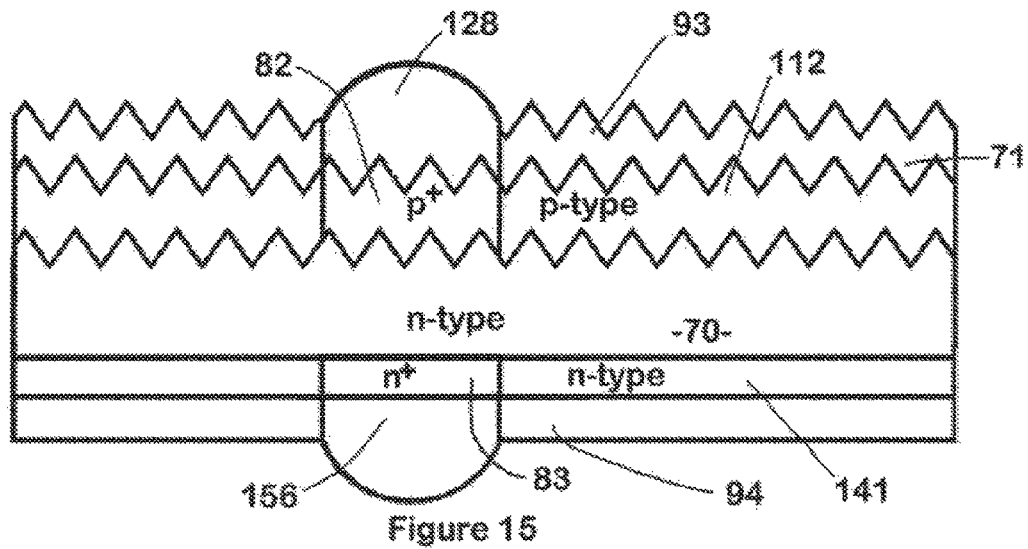
FIG. 15 diagrammatically illustrates the wafer of FIG. 14 after rear surface metallisation is applied.

The structure of FIG. 15 can also be achieved by variations of the above process.

(ii) Example 2—Local Deactivation

Figure 16:
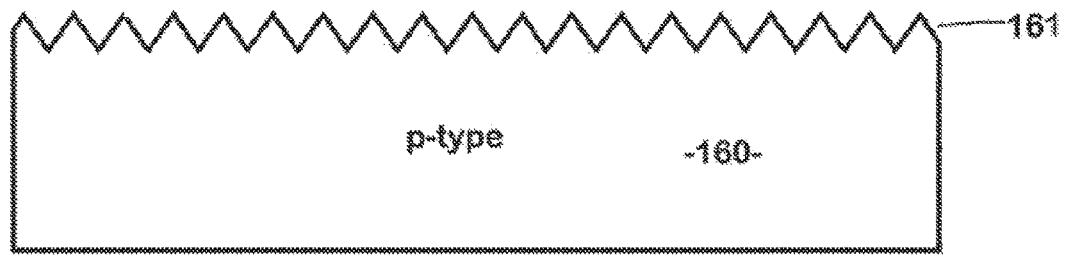
FIG. 16 diagrammatically illustrates a textured p-type wafer in which an embodiment of the invention may be formed.
Figure 17:
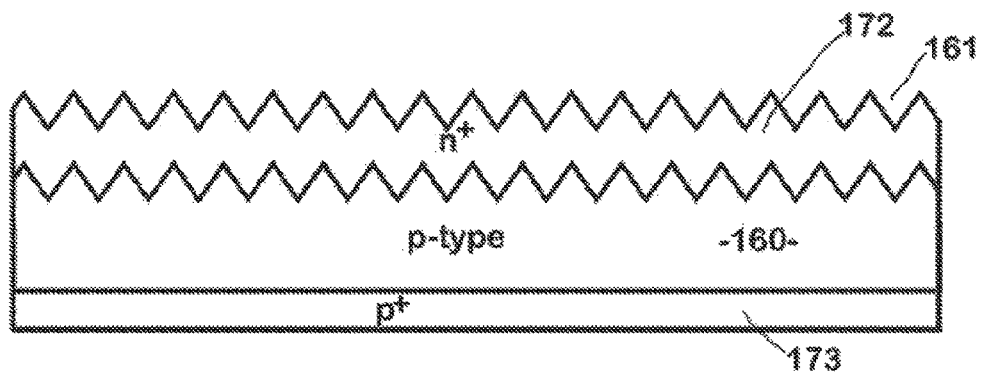
FIG. 17 diagrammatically illustrates the wafer of FIG. 16 after initial doping of the front and rear surfaces.
Figure 18:
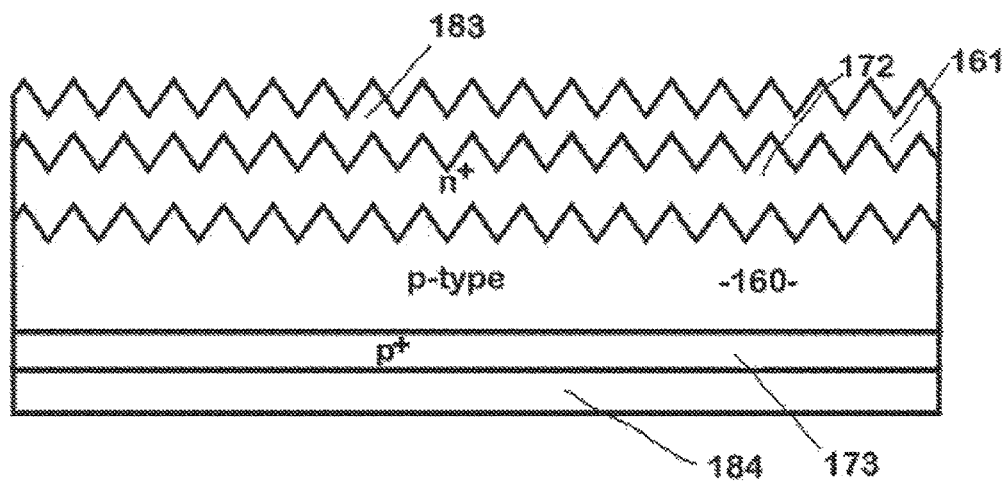
FIG. 18 diagrammatically illustrates the wafer of FIG. 17 after dielectric layers are added.
Figure 19:
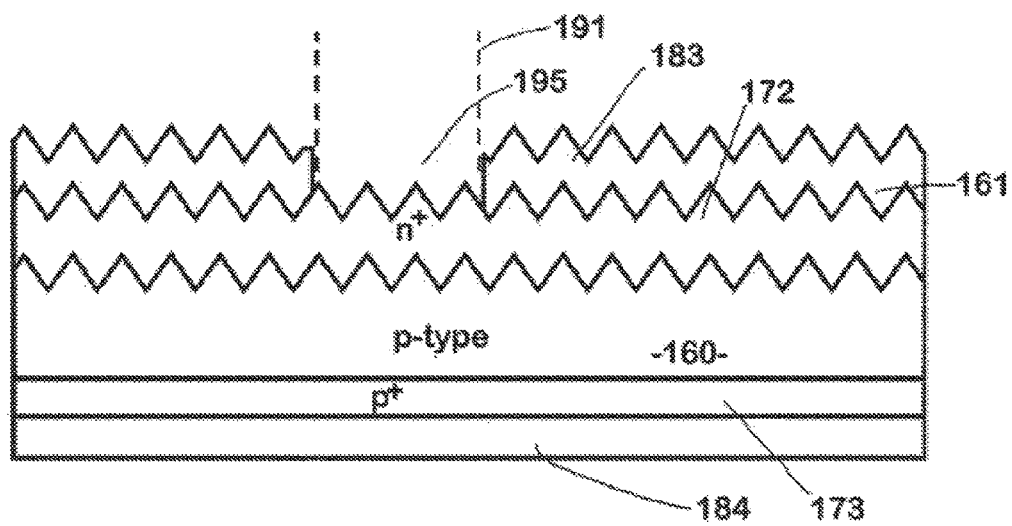
FIG. 19 diagrammatically illustrates the wafer of FIG. 18 after patterning of the top surface dielectric.
Figure 20:
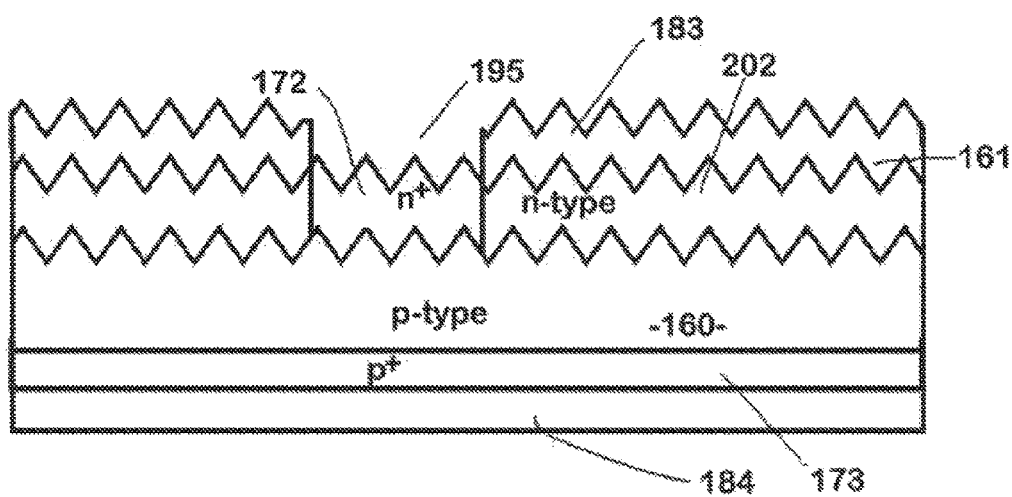
FIG. 20 diagrammatically illustrates the wafer of FIG. 19 after hydrogenation of the emitter region.

1) Referring to FIG. 16, a p-type wafer 160 is textured 161;
2) A phosphorus diffusion of the top surface to notionally achieve an n$^+$ region with a sheet resistance of 45-55Ω/☐ (but which could be anywhere within a range of 1-80Ω/☐) creates an emitter layer 172 seen in FIG. 17;
3) A boron diffusion 173 may also be added to the rear surface to again, notionally achieve an p$^-$ region with a sheet resistance of 45-55Ω/☐ (but which could be anywhere within a range of 1-80Ω/☐) as also seen in FIG. 17;
4) A front surface dielectric layer 183 and a rear surface dielectric layer 184 are then deposited as seen in FIG. 18. The dielectric layers 183 & 184 act as hydrogen sources and may be selected from hydrogen containing dielectric materials such as silicon nitride, silicon oxynitride, aluminium oxides etc.;

5) The front surface dielectric layer 183 is patterned as seen in FIG. 19, to create openings 195 for emitter metallisation. This can be done by a laser 191, by screen printing or ink jet patterning or other suitable known processes;

6) Referring to FIG. 20, hydrogenation of the emitter is performed, in areas of silicon 202 where the dielectric 183 has not been removed (i.e. where hydrogen source is present), such as by heating the device to 400° C. in darkness or low light. This process manipulates the charge state in such a way that phosphorus is deactivated wherever hydrogen is present. Phosphorus is deactivated by hydrogen (H$^-$) which bonds with the positive phosphorus atoms that are active in the silicon lattice. Hydrogenation performed in a manner which maximises the amount of H$^-$ present will enable the H$^-$ to bond with the P$^+$ thereby de-activating the phosphorus and creating higher sheet resistivity material in these regions, while leaving lower sheet resistivity regions 172 where the dielectric hydrogen source has been removed to form openings 195 for the subsequent formation of metal contacts. Note that the percentage of atomic hydrogen in the negative charge state is maximised by keeping the hole concentration low such as by minimising the light generation of carriers by minimising the light from the heaters which have photons with energy levels above the bandgap of silicon (1.12 eV) and by avoiding temperatures significantly above 300°-500° C. that is typically necessary for reasonable hydrogen mobility and the release of hydrogen from the dielectric hydrogen sources 183.

Figure 21:
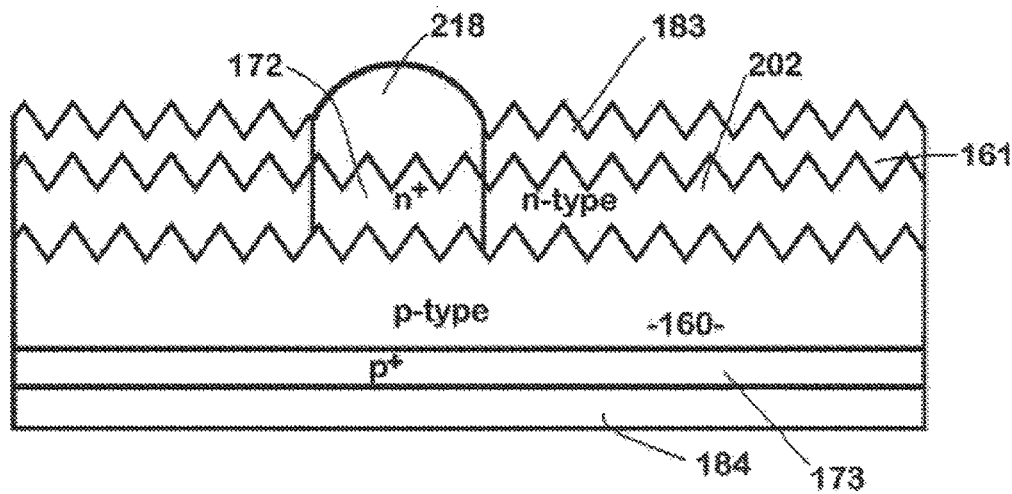
FIG. 21 diagrammatically illustrates the wafer of FIG. 20 after emitter metallisation is applied.

7) Metal contacts 218 may then be applied to the exposed n$^+$ regions 172, such as by plating or aligned screen printing, as seen in FIG. 21.

Figure 22:
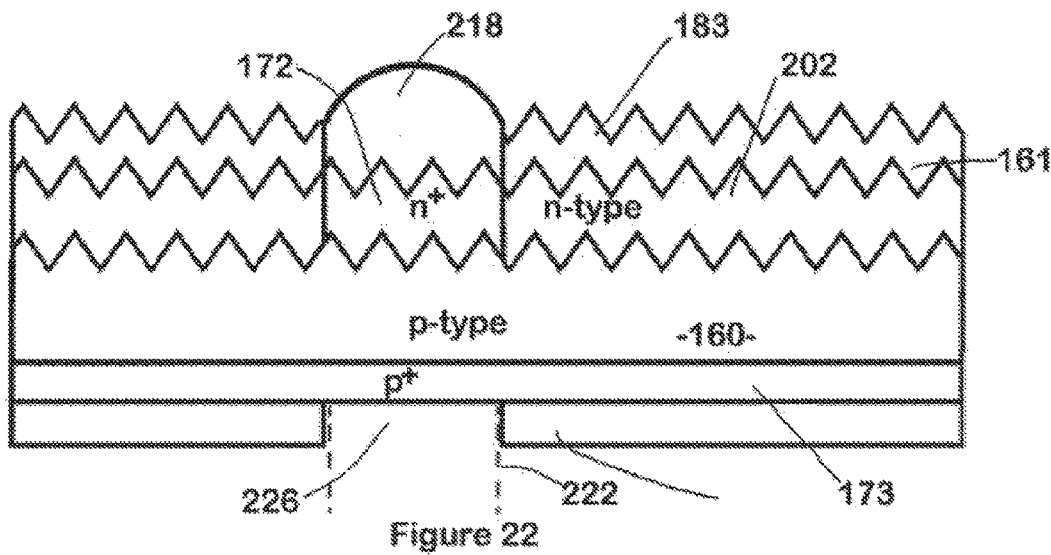
FIG. 22 diagrammatically illustrates the wafer of FIG. 21 after patterning of the rear surface dielectric.
Figure 23:
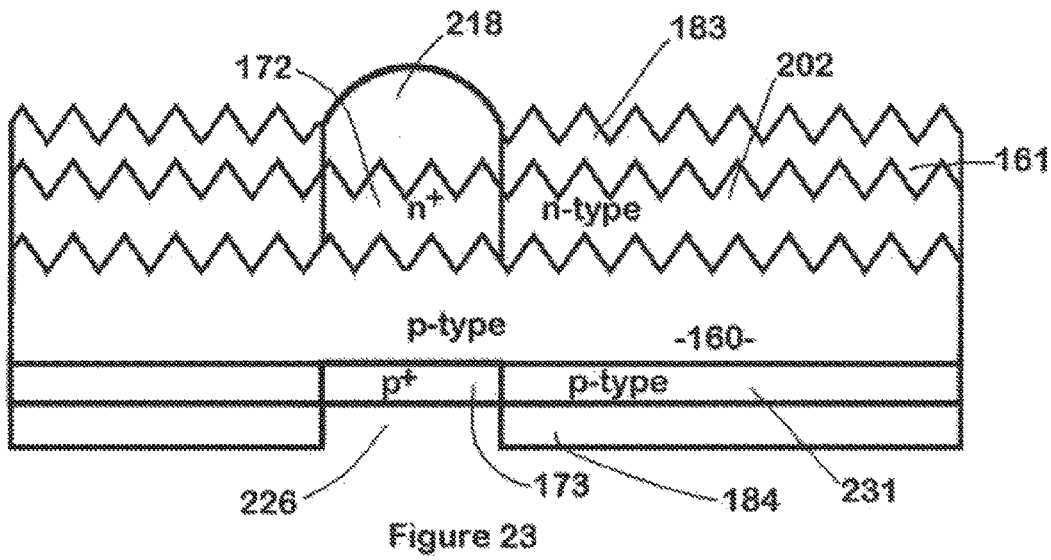
FIG. 23 diagrammatically illustrates the wafer of FIG. 22 after hydrogenation of the rear doped region.

8) The rear surface dielectric layer 184 is patterned as seen in FIG. 22, to create openings 226 for rear metallisation. This can be done by a laser 222, by screen printing or inkjet patterning or other suitable known processes;

9) Referring to FIG. 23, hydrogenation of the p+ region of the rear surface is performed, in areas of silicon 231 where the dielectric 184 has not been removed (i.e. where hydrogen source is present), such as by heating the device to 400° C. in darkness or low light. This process maximises the H$^+$ percentage while retaining reasonable release of hydrogen into the silicon in such a way that boron is deactivated wherever hydrogen is present. Boron is deactivated by hydrogen (H$^+$) which bonds with the negative boron atoms that are active in the silicon lattice. Hydrogenation performed in a manner which maximises the amount of H$^+$ present will enable the H$^+$ to bond with the B$^-$ thereby de-activating the boron and creating higher sheet resistivity material in these regions, while leaving lower sheet resistivity regions 83 where the dielectric hydrogen source 94 has been removed to form openings 136 for the subsequent formation of metal contacts. Note that the percentage of atomic hydrogen in the positive charge state is maximised by keeping the electron concentration low such as by minimising the light generation of carriers which is in turn minimised by minimising the light incident on the wafer which necessitates the use of heaters that radiate minimal light which has photons with energy levels above the bandgap of silicon (1.12 eV) and by avoiding temperatures above about 300°-500° C. that are desirable for reasonable hydrogen mobility and the release of hydrogen from the dielectric hydrogen sources 184. For simplicity, the identical conditions have been described for phosphorus and boron deactivation so as to facilitate simultaneous deactivation of both the phosphorus at the front and boron at the rear. However for optimal electronic performance, different hydrogenation (deactivation) processing conditions may be beneficial for the phosphorus and boron such that the two processes should therefore be carried out separately.

Figure 24:
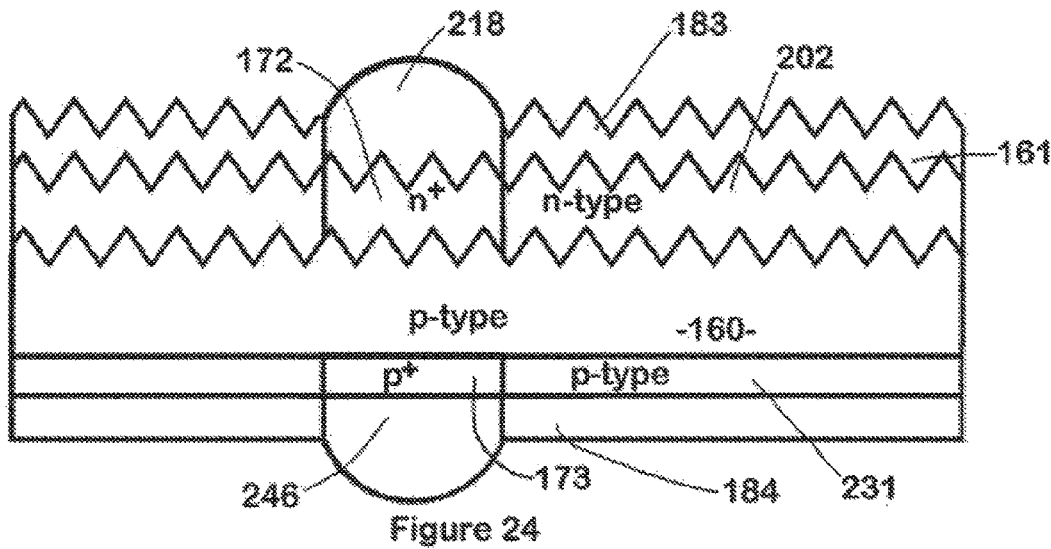
FIG. 24 diagrammatically illustrates the wafer of FIG. 23 after rear surface metallisation is applied.

10) Metal contacts 246 may then be applied to the exposed p$^+$ regions 83, such as by plating or aligned screen printing, as seen in FIG. 24.

The structure of FIG. 24 can also be achieved by variations of the above process.

Lamination

Figure 25:
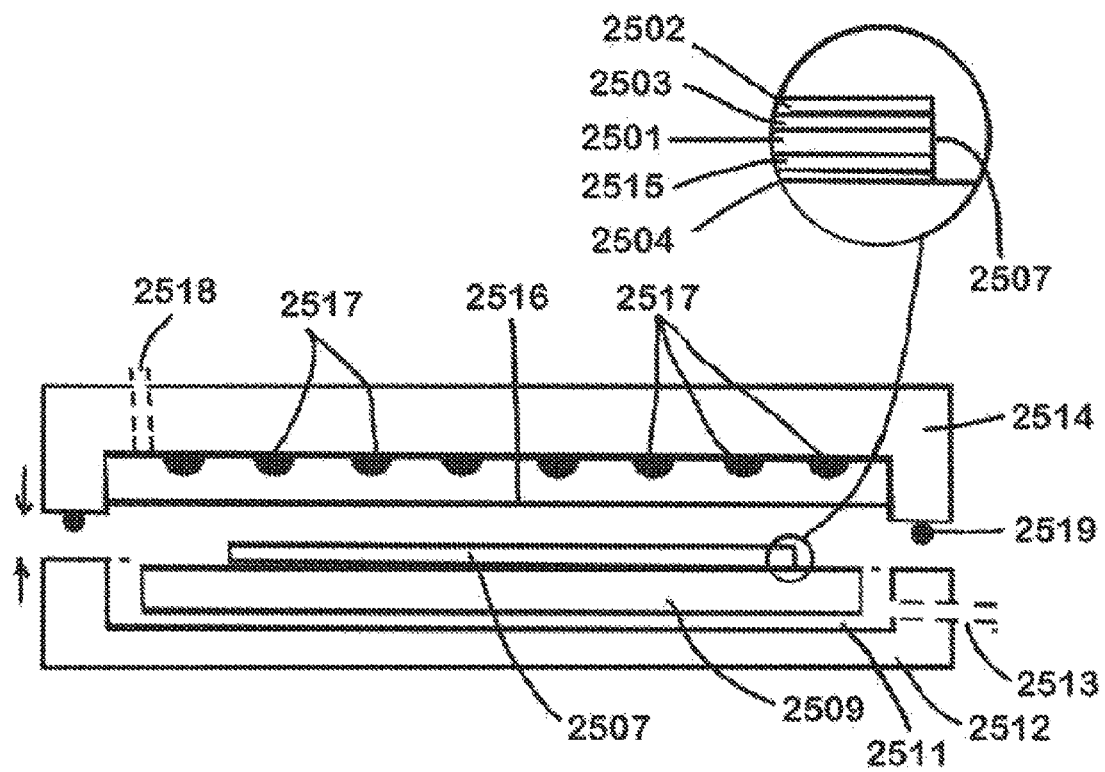
FIGS. 25 & 26 diagrammatically illustrate a laminator, in the open and closed states, modified to permit illumination of the solar cell during the lamination process.
Figure 26:
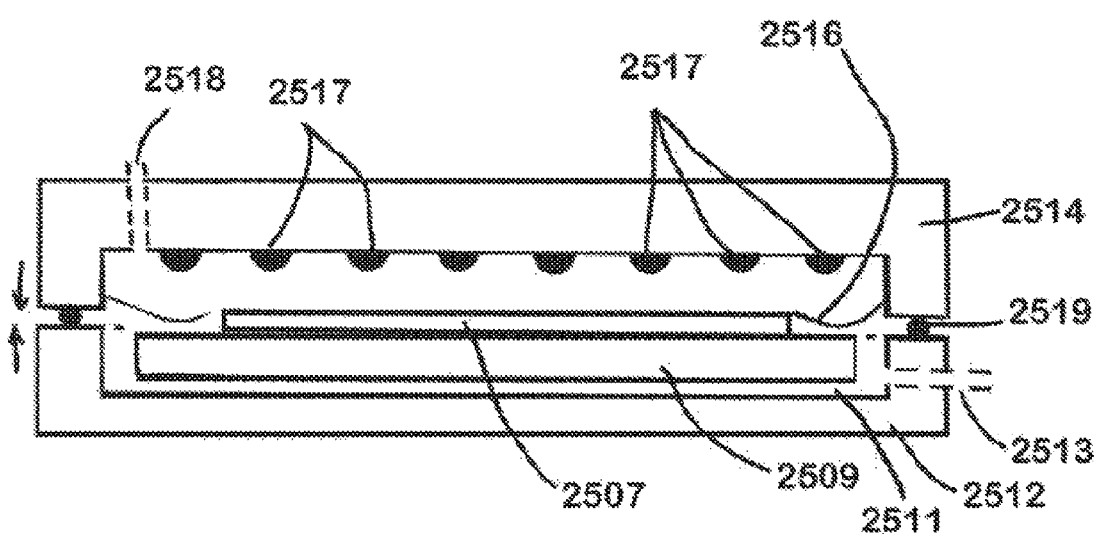

Referring to FIGS. 25 & 26, a modified laminator is illustrated in the opened (FIG. 25) and closed (FIG. 26) states. When fabrication of the active part of the solar cell 2501 (in this case for example a device of the type seen in FIG. 15) is completed it is usually encapsulated to protect it in use. The encapsulating layers will generally comprise a glass topsheet 2502 and a bonding layer 2503 such as ethylene vinyl acetate (EVA) on the front surface and a glass backsheet or white backsheet 2504 and a bonding layer 2505 again such as EVA, on the rear surface. With the encapsulating layers 2502, 2503, 2504, 2505 applied to the device 2501, the laminates 2507 are placed into the laminator 2508 as seen in FIG. 25. The laminates 2507 are placed on the platen 2509 which is capable of being heated when the laminator is in operation. The platen 2509 is located in a lower cavity 2511 of a lower housing 2512 which has an outlet port 2513 connected to a vacuum pump (not shown). An upper housing 2514 includes an upper cavity 2515, closed by a transparent (or at least translucent) flexible membrane 2516. Lamps 2517 are located within the upper cavity 2515 directed towards the platen 2507 to illuminate the solar cell 2501 during the lamination and cooling process. An inlet port 2518 connects to the upper cavity 2515 and the port is connected to a pressure pump (not shown) to allow pressurisation of the upper cavity 2515. Seals 2519 are provided between the upper housing 2514 and lower housing 2512 to seal the lower cavity 2511 when the laminator is closed as seen in FIG. 26.

In use the laminate 2507 is placed on the platen 2509 and the laminator closed. The lower cavity 2511 is then evacuated to prevent bubbles in the lamination and a higher pressure is established in the upper cavity 2515 relative to the lower cavity 2511, to press the laminations together as seen in FIG. 26 (Note however that the upper cavity 2515 may still be at a pressure which is less than atmospheric pressure). The platen 2509 is then heated to 150-200° C. to fuse the laminations together. While the platen 2509 is heated, the lamps 2517 are illuminated to illuminate the cell 2501 with a cumulative power of all the incident photons with sufficient energy to generate electron hole pairs within the silicon (in other words photons with energy levels above the bandgap of silicon of 1.12 eV) is at least 20 mW/cm$^2$, thereby generating electron-hole pairs. The combined heat and illumination will cause hydrogen to be released from dopants to which is it bonded and will allow at least some of the hydrogen to assume a charge state that enables it to move within the silicon to passivate recombination sites within the silicon.

After an appropriate heating time (which will be as for the prior art lamination processes) the heaters in the platen 25019 are turned off and the now fused laminate 2507 is allowed to cool while the illumination is maintained to minimise recombination of the hydrogen with the dopants. Once the solar cell 2501 is sufficiently cool (say <100° C. but preferably <40° C.) the lights 2517 and the pressure and vacuum pumps turned off and the laminator opened so that the laminate 2507 may be removed.

Figure 27:
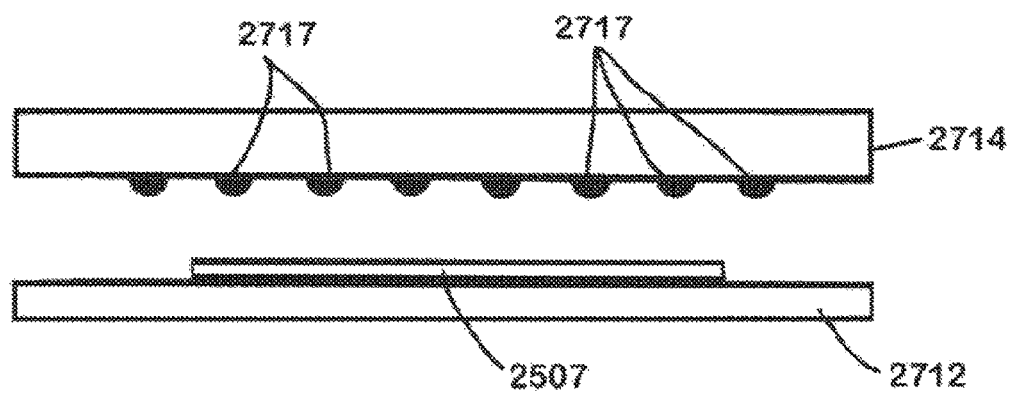
FIG. 27 diagrammatically illustrates a cooling station which may be used to cool an encapsulated module.

Alternatively the laminates 2507 after they are bonded may be removed from the platen 2509 of the laminator seen in FIGS. 25 & 26 and placed in a cooling station as illustrated, by way of example in FIG. 27. The cooling station has a platform 2712 that supports the laminated solar cell module 2507, and a hood 2714 in which lights 2717 are mounted to maintain illumination of the device during cooling. In yet a further possible arrangement, the hood 2714 might not be fitted with lights and the cooling may take place in the dark or in ambient light. A cooling station might also include belt transport and be configured similarly to the sooling stage of the belt furnace described below, with or without illumination.

Belt Furnace Modification

Belt furnaces are commonly used for heat processing of semiconductor devices. By modifying a belt furnace to incorporate illumination sources in the heating and cooling stages, such that heating and cooling may be performed under illumination, belt furnaces may be used to perform hydrogenation or to redistribute hydrogen in the device being processed. Such a modified belt furnace may also be used in a "dark" mode with some or all of the illumination disabled for dark processing.

Figure 28:
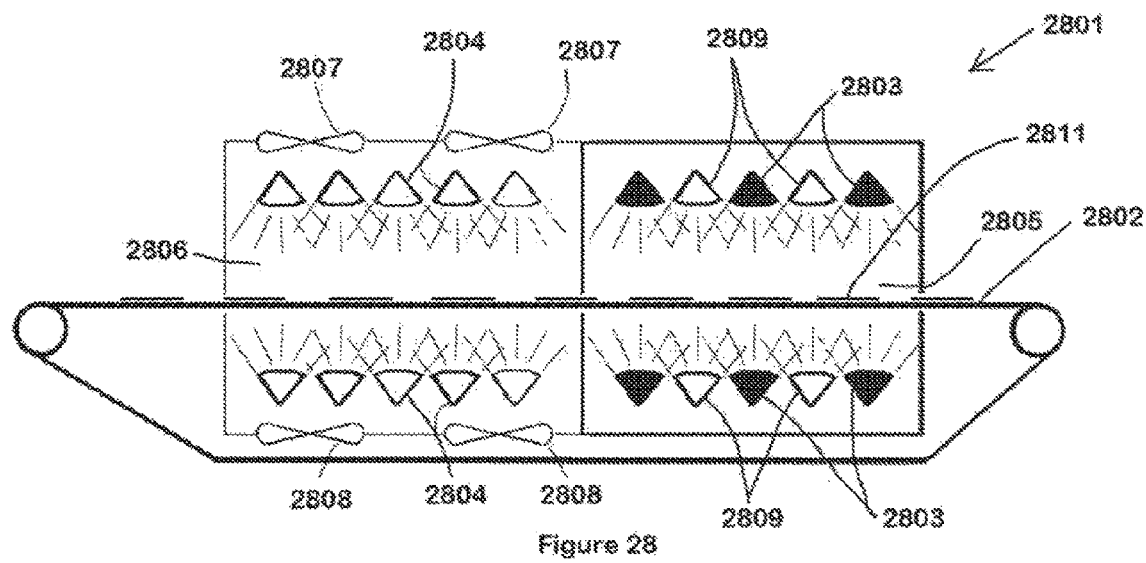
FIGS. 28 & 29 diagrammatically illustrate two examples of belt furnaces modified to provide illumination in the heating and cooling zones.

Referring to FIG. 28, a first modified belt furnace 2801 is illustrated. As with a conventional belt furnace, the furnace of FIG. 28 has a heat resistant belt 2802 (e.g. a ceramic roller or metal link style belt that passes through the furnace and extends from each end for loading and unloading. The furnace has a heating zone 2805 and a cooling zone 2806. Through which the bell passes. As with some conventional belt furnaces the heating zone has heating lamps 2803 that direct heat at the belt 2802 and anything carried on the belt, such as a wafer 2811 undergoing hydrogenation in the process to make a solar cell. The heating lamps 2803 typically produce radiant heat, and may be high-powered lights that produce large amounts of radiant heat such as infrared lamps. In the present modified belt furnace, the heaters may be high powered lights which are chosen (or driven differently) to also provide high levels of light. Alternatively supplementary lighting 2809 may optionally also be provided. Ideally light levels from 0.1 suns up to 100 suns might be provided in the heating zone 2805, in the cooling zone of a conventional belt furnace, cooling is performed in the dark. However in the present modified belt furnace 2801, lamps 2804 are provided in the cooling zone 2806 such that solar cells processed in the belt furnace may be illuminated during cool-down. The lamps 2804 in the cooling zone may advantageously provide less heating than the lamps in the heating zone. This may be achieved by using cooler or more efficient (e.g. non infra-red) lamps or by using infra-red-lamps and taking measures to minimise the healing effect or to provide additional forced cooling. For example the lamps 2804 in the cooling zone 2806 may be pulsed (taking advantage of the lifetime of the light induced charge states and/or the lifetime of the generated electron-hole pairs) to reduce their average heat output. Alternatively the cooling zone 2806 may optionally be cooled by passing cooling air through the cooling zone using inlet fans 2807 and exhaust fans 2808 to counteract any heating effects of the lamps 2804, to more rapidly bring the target device below a temperature at which the hydrogen passivated defects in the device will become stable. The cooling air may be chilled. Alternatively other gasses may be introduced at low temperature to assist cooling.

Figure 29:
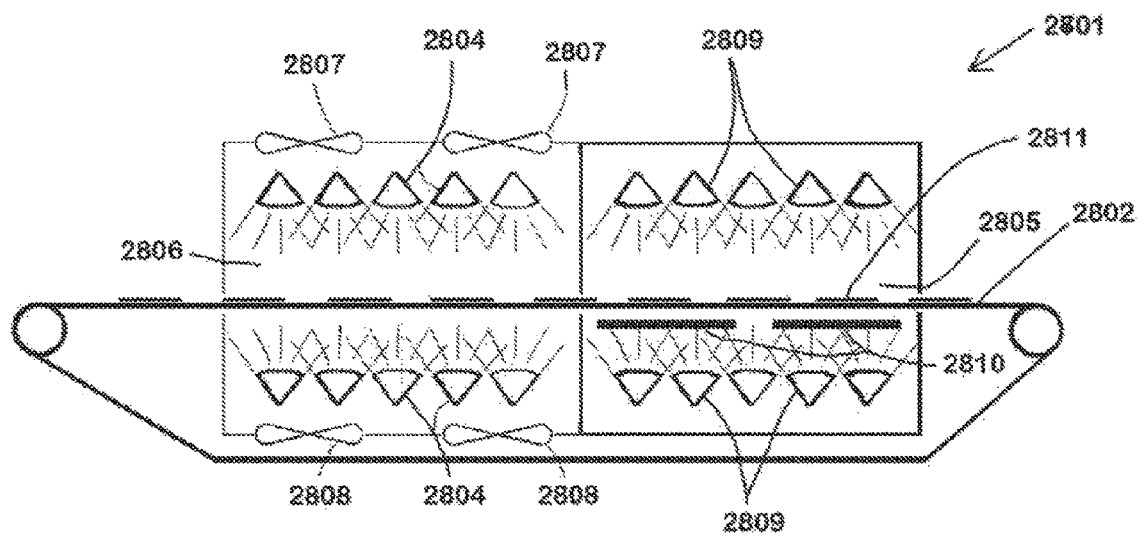

Referring to FIG. 29, a second modified belt furnace 2801 is illustrated. As with a conventional belt furnace, and also the previous example, the furnace of FIG. 37 has a heat resistant belt 2802 (e.g. a metal link style belt which passes through the furnace and extends from each end for loading and unloading). The furnace has a heating zone 2805 and a cooling zone 2806, through which the belt passes. As with some conventional belt furnaces the heating zone in this case has plate heaters 2810, which direct heat from beneath the belt 2802 to heat anything carried on the belt, such as a wafer 2811 undergoing hydrogenation in the process to make a solar cell. In this case supplementary lighting 2809 is provided in the heating zone 2805, as there would be no lighting in the heating zone of a conventional belt furnace, which used plate or resistive heaters. Again, ideally light levels of up to 100 suns might be provided in the heating zone 2805. In the cooling zone of a conventional belt furnace, cooling is performed in the dark. However in the present modified belt furnace 2801, as with the previous example, lamps 2804 are provided in the cooling zone 2806 such that solar cells processed in the belt furnace may be illuminated during cool-down. The cooling zone 2806 of FIG. 29 may be identical to that of FIG. 28.

The invention claimed is:

1. A method for the processing of a device, having a crystalline silicon region containing an internal hydrogen source, the method comprising
   i) applying encapsulating material to each of front and rear surfaces of the device to form a lamination;
   ii) applying pressure to the lamination and heating the lamination to bond the encapsulating material to the device; and
   iii) cooling the device;
   wherein during at least one of the heating step and the cooling step the device is illuminated to generate electron-hole pairs within the silicon region.

2. The method of claim 1 wherein the device is illuminated during the cooling step and during the heating step.

3. The method as claimed claim 1, wherein the crystalline silicon region containing the hydrogen source comprises atomic hydrogen contained interstitially within the crystalline silicon of the crystalline silicon region.

4. The method as claimed in claim 1, wherein the crystalline silicon region containing the hydrogen source comprises a doped crystalline silicon region in which some of the dopant atoms are deactivated by combining with a hydrogen atom.

5. The method as claimed in claim 4, wherein while the crystalline silicon region is at an elevated temperature, some of the deactivated dopant atoms are reactivated by illuminating the doped crystalline silicon region.

6. The method as claimed in claim 4, wherein the encapsulating material comprises a bonding sheet applied to each surface of the device and a glass sheet over each bonding sheet and the step of applying pressure and heating causes the bonding sheets to bond to the respective the glass sheet and the respective surface of the device.

7. The method of claim 6, wherein each bonding sheet is a sheet of ethylene vinyl acetate (EVA) material.

8. The method as claimed in claim 1, wherein the crystalline silicon region comprises a doped crystalline silicon region, and wherein is a surface region of the device.

9. The method as claimed in claim 1, wherein hydrogen is introduced into the crystalline silicon region by forming a dielectric hydrogen source on a surface of the crystalline silicon region and subsequently heating the device to migrate the hydrogen into the crystalline silicon region.

10. The method as claimed in claim 9, wherein hydrogen is introduced into the crystalline silicon region from the dielectric hydrogen source to deactivate dopant atoms in the crystalline silicon region, by heating the device in the absence of illumination or in low illumination conditions.

11. The method as claimed in claim 10, wherein dielectric hydrogen sources are formed on each of the front and rear surfaces of the device.

12. The method as claimed in claim 10, wherein the dielectric hydrogen source comprises layers of one or more of silicon nitride, amorphous silicon, silicon oxynitride, and aluminium oxides.

13. The method as claimed in claim 10, wherein the device comprises a silicon surface n-type diffused layer through which hydrogen must diffuse and the silicon surface n-type diffused layer has a net active doping concentration of $1 \times 10^{20}$ atoms/cm$^3$ or less.

14. The method as claimed in claim 10, wherein the device comprises a silicon surface diffused p-type layer through which hydrogen must diffuse and the silicon surface diffused p-type layer has a net active doping concentration of $1 \times 10^{19}$ atoms/cm$^3$ or less.

15. The method as claimed in claim 1, wherein the heating of the device comprises heating at least a region of the device to at least 40° C. while simultaneously illuminating at least some of the device with at least one light source whereby cumulative power of all the incident photons with sufficient energy to generate electron hole pairs within silicon is at least 20 mW/cm$^2$.

16. The method as claimed in claim 1, wherein the illumination of the device is from at least one light source and is provided at a level whereby cumulative power of all the incident photons with sufficient energy to generate electron hole pairs within silicon is at least 50 mW/cm$^2$, or 60 mW/cm$^2$, or 70 mW/cm$^2$, or 80 mW/cm$^2$, or 90 mW/cm$^2$, or 100 mW/cm$^2$, or 150 mW/cm$^2$, 200 mW/cm$^2$, or 300 mW/cm$^2$, or 400 mW/cm$^2$, or 500 mW/cm$^2$, or 600 mW/cm$^2$, or 700 mW/cm$^2$, or 800 mW/cm$^2$, or 900 mW/cm$^2$, or 1000 mW/cm$^2$, or 1500 mW/cm$^2$, 2000 mW/cm$^2$, or 3000 mW/cm$^2$, or 5000 mW/cm$^2$, or 10000 mW/cm$^2$, or 15000 mW/cm$^2$, or 20000 mW/cm$^2$, or up to a light intensity at which crystalline silicon begins to melt.

17. The method as claimed in claim 1, wherein for each of the ranges of cumulative power, the heating of the device comprises heating at least a region of the device to at least 100° C., or to at least 140° C., or to at least 150° C., or to at least 180° C., or to at least 200° C.

18. The method as claimed in claim 1, wherein heating of the device is followed by cooling the device while simultaneously illuminating at least some of the device with at least one light source whereby the cumulative power of all the incident photons with sufficient energy to generate electron hole pairs within silicon is at least 20 mW/cm$^2$.

19. The method as claimed in claim 1, wherein a source of illumination applied to the device is an array of LEDs, or a laser, or one or more infra-red lamps.

20. The method as claimed in claim 1, wherein the illumination applied to the device is pulsed.

21. The method as claimed in claim 1, wherein the intensity of illumination applied to the device is controlled to maintain the Fermi level at a value of 0.10 to 0.22 ev above mid-gap.

22. The method as claimed in claim 1, wherein the device comprises a photovoltaic device having at least one rectifying junction.

23. The method as claimed in claim 1, wherein the crystalline silicon region comprises a doped crystalline silicon region, and wherein the doped crystalline silicon region is doped with a p-type (valency 3) dopant selected from boron, aluminium and gallium.

24. The method as claimed in claim 23, wherein the doped crystalline silicon region is doped with boron.

25. The method as claimed in claim 23, wherein the doped crystalline silicon region is doped with an n-type (valency 3) dopant.

26. The method as claimed in claim 23, wherein the doped crystalline silicon region is doped with phosphorus.

27. The method as claimed in claim 23, wherein the doped crystalline silicon region is doped with boron and phosphorus.

28. A method for the processing of a device, having a crystalline silicon region containing an internal hydrogen source, the method comprising:
   i) applying encapsulating material to each of the front and rear surfaces of the device to form a lamination; and
   ii) applying pressure to the lamination and heating the lamination under illumination to bond the encapsulating material to the device, wherein the lamination is illuminated to generate electron-hole pairs within the crystalline silicon region.

29. A method for the processing of a device, having a crystalline silicon region containing an internal hydrogen source, the method comprising:
   i) applying encapsulating material to each of the front and rear surfaces of the device to form a lamination;
   ii) applying pressure to the lamination and heating the lamination to bond the encapsulating material to the device; and
   iii) cooling the device under illumination to generate electron-hole pairs within the crystalline silicon region.

* * * * *